US00RE45872E

(19) United States
(12) Reissued Patent
Terakawa et al.

(10) Patent Number: US RE45,872 E
(45) Date of Reissued Patent: Jan. 26, 2016

(54) PHOTOVOLTAIC CELL

(75) Inventors: Akira Terakawa, Hirakata (JP); Toshio Asaumi, Kobe (JP)

(73) Assignee: PANASONIC INTELLECTUAL PROPERTY MANAGEMENT CO., LTD., Osaka (JP)

(21) Appl. No.: 13/592,613

(22) Filed: Aug. 23, 2012

Related U.S. Patent Documents

Reissue of:
(64) Patent No.: 7,781,669
Issued: Aug. 24, 2010
Appl. No.: 11/361,367
Filed: Feb. 24, 2006

(30) Foreign Application Priority Data

Feb. 25, 2005 (JP) ..... 2005-051174
Feb. 28, 2005 (JP) ..... 2005-052741

(51) Int. Cl.
*H01L 25/00* (2006.01)
*H01L 31/0747* (2012.01)
(Continued)

(52) U.S. Cl.
CPC .... *H01L 31/0747* (2013.01); *H01L 31/022466* (2013.01); *H01L 31/035272* (2013.01); *Y02E 10/50* (2013.01)

(58) Field of Classification Search
CPC ..... H01L 31/022466; H01L 31/022475; H01L 31/022483; H01L 31/028; H01L 31/03682; H01L 31/036885; H01L 31/03685; H01L 31/035272; H01L 31/0747; Y02E 10/548; Y02E 10/547; Y02E 10/54; Y02E 10/50
USPC ..... 136/261
See application file for complete search history.

(56) References Cited

U.S. PATENT DOCUMENTS 4,336,648 A * 6/1982 Pschunder et al. ..... 438/64
4,487,989 A * 12/1984 Wakefield et al. ..... 136/256
(Continued)

FOREIGN PATENT DOCUMENTS

JP 7-249787 9/1995
JP 7-249788 9/1995
(Continued)

OTHER PUBLICATIONS

Tanaka et al, "Development of HIT solar cells with more than 21% conversion efficiency and commercialization of highest performance HIT module," 3rd World Conference on Photovoltaic Energy Conversion, May 11-18, 2003, Osaka, Japan.*
(Continued)

*Primary Examiner* — Alan Diamond
(74) *Attorney, Agent, or Firm* — McDermott Will & Emery LLP

(57) ABSTRACT

In a photovoltaic cell, an i-type amorphous silicon film and an n-type amorphous silicon film are formed in a region excluding a predetermined width of an outer periphery on a main surface of an n-type single crystalline silicon substrate. A front electrode is formed so as to cover the i-type amorphous silicon film and the n-type amorphous silicon film on a main surface of the n-type single crystalline silicon substrate. An i-type amorphous silicon film and a p-type amorphous silicon film are formed on the entire area of a back surface of the n-type single crystalline silicon substrate. A back electrode is formed in a region excluding a predetermined width of an outer periphery on the p-type amorphous silicon film. A surface, on the side of the front electrode, of the photovoltaic cell is a primary light incidence surface.

25 Claims, 12 Drawing Sheets

(51) Int. Cl.
*H01L 31/0224* (2006.01)
*H01L 31/0352* (2006.01)

(56) References Cited

U.S. PATENT DOCUMENTS

| | | | | |
|---|---|---|---|---|
| 5,034,068 | A * | 7/1991 | Glenn et al. | 136/256 |
| 5,213,628 | A | 5/1993 | Noguchi et al. | |
| 5,589,008 | A * | 12/1996 | Keppner | 136/259 |
| 5,705,828 | A | 1/1998 | Noguchi et al. | |
| 5,935,344 | A | 8/1999 | Endo et al. | 136/255 |
| 6,504,178 | B2 * | 1/2003 | Carlson et al. | 257/86 |
| 2001/0020486 | A1 | 9/2001 | Tsuge | 136/251 |
| 2003/0168660 | A1 * | 9/2003 | Terakawa et al. | 257/52 |

FOREIGN PATENT DOCUMENTS

| | | | | |
|---|---|---|---|---|
| JP | 7-95603 | | 10/1995 | |
| JP | 8-508368 | | 9/1996 | |
| JP | 2614561 | | 5/1997 | |
| JP | 9-153632 | | 6/1997 | |
| JP | 9-181343 | | 7/1997 | |
| JP | 9-181347 | | 7/1997 | |
| JP | 10-12903 | | 1/1998 | |
| JP | 11-224954 | | 8/1999 | |
| JP | 2994716 | | 12/1999 | |
| JP | 2001-44461 | | 2/2001 | |
| JP | 2001-345463 | | 12/2001 | |
| JP | 2002-76397 | | 5/2002 | |
| JP | 3349308 | | 11/2002 | |
| JP | 3469729 | | 11/2003 | |
| JP | 2004-221437 | | 8/2004 | |
| JP | 2004-221437 | A | 8/2004 | |
| JP | 2004-228281 | | 8/2004 | |
| JP | 3557148 | | 8/2004 | |
| JP | 2004221437 | | 8/2004 | |
| JP | 2004228281 | A * | 8/2004 | 136/261 |
| JP | 2004-289058 | | 10/2004 | |
| JP | 2004-289058 | A | 10/2004 | |
| JP | 2005-191024 | | 7/2005 | |

OTHER PUBLICATIONS

Machine translation of JP 2004-228281A, Aug. 2004.*
English Abstract and Machine Translation for JP 2004-289058 A, published Oct. 14, 2004.
English Abstract and Machine Translation for JP 2004-221437 A, published Aug. 5, 2004.
Office Action issued Mar. 6, 2012 in a Japanese Application No. JP 2009-205926.
Amendments to the Office Action issued Mar. 6, 2012 in a Japanese Application No. JP 2009-205926.
Arguments to the Office Action issued Mar. 6, 2012 in a Japanese Application No. JP 2009-205926.
Decision of Patent issued May 29, 2012 in a Japanese Application No. JP 2009-205926.
Search report issued on Jun. 29, 2006 in the counterpart European applicaiton.
Japanese Decision of Refusal in counterpart Japanese Patent Application, dated Oct. 27, 2009; partial English translation included.

* cited by examiner

PHOTOVOLTAIC CELL

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*CROSS REFERENCE TO RELATED APPLICATIONS*

*This application is a broadened reissue application of U.S. Pat. No. 7,781,669 issued on Aug. 24, 2010, on an application Ser. No. 11/361,367 filed Feb. 14, 2006, claiming the benefit of priority date of Japanese Patent Application No. 2005-051174 filed on Feb. 25, 2005, now JP Patent No. 4,502,845, and Japanese Patent Application 2005-052741 filed on Feb. 28, 2005, now JP Patent No. 4,744,161, the disclosures of each of which are incorporated herein by reference.*

BACKGROUND OF THE INVENTION

1. Field of the Invention

The present invention relates to a photovoltaic cell using a semiconductor junction.

2. Description of the Background Art

In recent years, photovoltaic cells having pn junctions between n-type single crystalline silicon substrates and p-type amorphous silicon films have been developed. In such photovoltaic cells, fill factors F.F. must be improved while maintaining high short-circuit currents Isc and open voltages Voc in order to improve photoelectric conversion efficiencies.

In the junctions between the n-type single crystalline silicon substrates and the p-type amorphous silicon films, however, a large number of interface states exist. Therefore, recombination of carries occurs, so that the open voltages Voc are reduced.

Therefore, a photovoltaic cell having an HIT (Heterojunction with Intrinsic Thin-Layer) structure in which a substantially intrinsic amorphous silicon film (an i-type amorphous silicon film) is inserted between an n-type single crystalline silicon substrate and a p-type amorphous silicon film in order to restrain recombination of carriers in a junction between the n-type single crystalline silicon substrate and the p-type amorphous silicon film has been proposed (see JP 2001-345463 A, for example).

Alternatively, a photovoltaic cell having a BSF (Back Surface Field) structure in which an i-type amorphous silicon film and an n-type amorphous silicon film are formed on a back surface of an n-type single crystalline silicon substrate in order to restrain recombination of carriers on the back surface of the n-type single crystalline silicon substrate has been also known.

In order to further enhance the photoelectric conversion efficiency of the photovoltaic cell, the area of the amorphous silicon film formed on the main surface and the back surface of the n-type single crystalline silicon substrate may be made as large as possible to improve the collection factor of photoproduction carriers. That is, the amorphous silicon film may be formed on the respective entire areas of the main surface and the back surface of the n-type single crystalline silicon substrate.

In the above-mentioned formation of the amorphous silicon film, a plasma CVD (Chemical Vapor Deposition) method has been generally used. Here, an attempt to form an i-type amorphous silicon film and a p-type amorphous silicon film by the plasma CVD method in the entire area of the main surface of the n-type single crystalline silicon substrate may cause the i-type and p-type amorphous silicon films to be detoured around a side surface and the back surface of the n-type single crystalline silicon substrate. Similarly, an attempt to form the i-type amorphous silicon film and the n-type amorphous silicon film by the plasma CVD method in the entire area of the back surface of the n-type single crystalline silicon substrate may cause the i-type and n-type amorphous silicon films to be detoured around the side surface and the main surface of the n-type single crystalline silicon substrate. In this case, the p-type amorphous silicon film on the main surface of the n-type single crystalline silicon substrate and the n-type amorphous silicon film on the back surface thereof come into contact with each other on the side surface of the n-type single crystalline silicon substrate, so that a leak current is generated. Thus, the photoelectric conversion efficiency of the photovoltaic cell is reduced.

In order to solve such a problem, therefore, a photovoltaic cell in which a p-type amorphous silicon film on a main surface of an n-type single crystalline silicon substrate and an n-type amorphous silicon film on a back surface thereof are prevented from coming into contact with each other by reducing the respective areas of an i-type amorphous silicon film and the n-type amorphous silicon film that are formed on the back surface of the n-type single crystalline silicon substrate has been proposed (see JP 2001-44461 A, for example).

In the photovoltaic cell in which the area of the amorphous silicon film formed on the back surface of the n-type single crystalline silicon substrate is reduced, as described above, however, generated photocarriers are not collected in a portion having no amorphous silicon film formed therein on the back surface of the n-type single crystalline silicon substrate, so that the photocarriers may be recombined at surface states. Particularly in a case where a surface, on the side of the n-type amorphous silicon film, of the photovoltaic cell is a light incidence surface, an output current of the photovoltaic cell is reduced.

SUMMARY OF THE INVENTION

An object of the present invention is to provide a photovoltaic cell whose output characteristics are improved.

In the specification, a crystal-based semiconductor shall include a single crystalline semiconductor and a polycrystalline semiconductor, and an amorphous-based semiconductor shall include an amorphous semiconductor and a microcrystalline semiconductor.

An intrinsic amorphous-based semiconductor is an amorphous-based semiconductor film in which impurities are not intentionally doped, and also includes an amorphous-based semiconductor film including impurities inherently contained in a semiconductor raw material and impurities naturally contained in the manufacturing process.

(1)

A photovoltaic cell according to an aspect of the present invention comprises a crystal-based semiconductor of one conductivity type; a first substantially intrinsic amorphous-based semiconductor film; a second amorphous-based semiconductor film of a conductivity type identical or opposite to the crystal-based semiconductor; and a first translucent electrode layer, the first amorphous-based semiconductor film, the second amorphous-based semiconductor film, and the first electrode layer being provided in this order on a first surface of the crystal-based semiconductor, the second amorphous-based semiconductor film being formed in a first region excluding an outer periphery with a predetermined width on the crystal-based semiconductor or the first amorphous-based semiconductor film, and the first electrode layer being formed so as to cover a region extending to the outer periphery on the crystal-based semiconductor or the first amorphous-based semiconductor film from the top of the second amorphous-based semiconductor film.

In the photovoltaic cell, the first and second amorphous-based semiconductor films are formed on the first surface of the crystal-based semiconductor, and the first electrode layer is formed so as to cover the region extending to the outer periphery on the crystal-based semiconductor or the first amorphous-based semiconductor film from the top of the second amorphous-based semiconductor film.

In this case, the first electrode layer is formed in the outer periphery on the crystal-based semiconductor or the first amorphous-based semiconductor film, so that photocarriers generated in the outer periphery on the crystal-based semiconductor or the first amorphous-based semiconductor film can be moved to the first electrode layer. Thus, the photocarriers that are recombined at surface states in the outer periphery on the crystal-based semiconductor or the first amorphous-based semiconductor film can be reduced. As a result, the output characteristics of the photovoltaic cell are improved.

(2)

A surface, on the side of the first electrode layer, of the photovoltaic cell may be a primary light incidence surface. In this case, the first and second amorphous-based semiconductor films and the first electrode layer are formed on the side of the light incidence surface of the crystal-based semiconductor, so that the photocarriers having a high concentration generated on the side of the light incidence surface of the crystal-based semiconductor can be efficiently collected. Thus, the output characteristics of the photovoltaic cell are further improved.

(3)

The first amorphous-based semiconductor film may be formed in the first region, and the first electrode layer may be formed so as to cover a region extending to the outer periphery on the crystal-based semiconductor from the top of the second amorphous-based semiconductor film.

In this case, the first electrode layer is formed in the outer periphery on the crystal-based semiconductor, so that the photocarriers generated in the outer periphery on the crystal-based semiconductor can be moved to the first electrode layer. Thus, the photocarriers that are recombined at surface states in the outer periphery on the crystal-based semiconductor can be reduced. As a result, the output characteristics of the photovoltaic cell are improved.

(4)

The first amorphous-based semiconductor film may be formed on the entire area of the first surface of the crystal-based semiconductor, and the first electrode layer may be formed so as to cover a region extending to the outer periphery on the first amorphous-based semiconductor film from the top of the second amorphous-based semiconductor film.

In this case, the first amorphous-based semiconductor film is formed on the entire area of the first surface of the crystal-based semiconductor, so that the photocarriers can be prevented from being recombined on the first surface of the crystal-based semiconductor. Since the first electrode layer is formed in the outer periphery on the first amorphous-based semiconductor film, the photocarriers in the outer periphery on the first amorphous-based semiconductor film can be moved to the first electrode layer. Thus, the photocarriers that are recombined at surface states in the outer periphery on the first amorphous-based semiconductor film can be reduced. As a result of these, the output characteristics of the photovoltaic cell are further improved.

(5)

The photovoltaic cell may further comprise a third substantially intrinsic amorphous-based semiconductor film, and a fourth amorphous-based semiconductor film of a conductivity type opposite to the second amorphous-based semiconductor film, and a second electrode layer, the third amorphous-based semiconductor film, the fourth amorphous-based semiconductor film, and the second electrode layer being provided in this order on a second surface of the crystal-based semiconductor.

In this case, the third amorphous-based semiconductor film is formed on the second surface of the crystal-based semiconductor, so that the photocarriers can be prevented from being recombined at surface states on the second surface. Since the fourth amorphous-based semiconductor film is formed on the third amorphous-based semiconductor film, the extraction efficiency of carriers is improved. As a result of these, the output characteristics of the photovoltaic cell are further improved.

(6)

The crystal-based semiconductor and the second amorphous-based semiconductor film may be of the identical conductivity type. In this case, the crystal-based semiconductor and the fourth amorphous-based semiconductor film may be of the opposite conductivity types. The photocarriers are mainly generated on the side of the second surface of the crystal-based semiconductor. Here, in a case where light is incident from the side of the first surface of the crystal-based semiconductor, the quantity of light incident on the crystal-based semiconductor is not reduced even if the thickness of the fourth amorphous-based semiconductor film is increased. Consequently, the thickness of the fourth amorphous-based semiconductor film can be increased without reducing the quantity of light received by the crystal-based semiconductor. Thus, the extraction efficiency of carriers by the crystal-based semiconductor and the fourth amorphous-based semiconductor film can be improved. As a result, the output characteristics of the photovoltaic cell can be improved.

(7)

The second electrode layer may be formed in a region excluding an outer periphery with a predetermined width on the fourth amorphous-based semiconductor film. In this case, the second electrode layer can be prevented from being formed up to the respective side surfaces of the crystal-based semiconductor and the third and the fourth amorphous-based semiconductor films. This prevents the first electrode layer and the second electrode layer from coming into contact with each other, so that a leak current can be prevented from being generated. As a result, the output characteristics of the photovoltaic cell are further improved.

(8)

A region where the second electrode layer is formed may be smaller than a region where the first electrode layer is formed. In this case, the second electrode layer can be reliably prevented from being formed up to the respective side surfaces of the crystal-based semiconductor and the third and the fourth amorphous-based semiconductor films. This reliably prevents the first electrode layer and the second electrode layer from coming into contact with each other, so that a leak current can be prevented from being generated. As a result, the output characteristics of the photovoltaic cell are reliably improved.

(9)

Regions where the third and fourth amorphous-based semiconductor films are respectively formed may be larger than the region where the first electrode layer is formed. In this case, the photocarriers can be reliably prevented from being recombined at surface states on the second surface of the crystal-based semiconductor. Thus, the output characteristics of the photovoltaic cell are further improved.

(10)

It is preferable that the thickness of the fourth amorphous-based semiconductor film is not less than 6 nm nor more than 80 nm.

Since the first translucent electrode layer is formed on the side of the first surface of the crystal-based semiconductor, and the fourth amorphous-based semiconductor film is formed on the side of the second surface of the crystal-based semiconductor, the quantity of light incident on the crystal-based semiconductor from the side of the first electrode layer is not reduced even if the thickness of the forth amorphous-based semiconductor film is increased. Even if the thickness of the fourth amorphous-based semiconductor film is set to not less than 6 nm, therefore, the quantity of light received by the crystal-based semiconductor is prevented from being reduced. Thus, the extraction efficiency of carriers in the crystal-based semiconductor can be improved while preventing the generation efficiency of photocarriers from being reduced. Even if the surface of the fourth amorphous-based semiconductor film is degraded in forming the second electrode layer, the fourth amorphous-based semiconductor film has a sufficient thickness, so that the effect thereof can be reduced.

Since the thickness of the fourth amorphous-based semiconductor film is not more than 80 nm, the absorption loss of light by the fourth amorphous-based semiconductor film can be reduced. Therefore, the respective quantities of light incident on the crystal-based semiconductor from the side of the second electrode layer and light incident on the crystal-based semiconductor by being reflected on the second electrode layer after being incident from the side of the first electrode layer can be prevented from being reduced.

As a result of these, the output characteristics of the photovoltaic cell are reliably improved.

(11)

It is preferable that the thickness of the fourth amorphous-based semiconductor film is not more than 40 nm. In this case, the absorption loss of light by the fourth amorphous-based semiconductor film can be reliably reduced. Therefore, the respective quantities of light incident on the crystal-based semiconductor from the side of the second electrode layer and light incident on the crystal-based semiconductor by being reflected on the second electrode layer after being incident from the side of the first electrode layer can be reliably prevented from being reduced. As a result, the output characteristics of the photovoltaic cell are reliably improved.

(12)

The conductivity type of the crystal-based semiconductor may be an n type. In this case, the manufacture is easy, so that the manufacturing cost is reduced.

(13)

It is preferable that the thickness of the second amorphous-based semiconductor film is not less than 2 nm nor more than 8 nm. In this case, even if the second amorphous-based semiconductor film is degraded in forming the first electrode layer, the effect thereof can be reduced, and the absorption loss of light by the second amorphous-based semiconductor film can be reduced. Thus, the output characteristics of the photovoltaic cell are further improved.

(14)

It is preferable that the thickness of the second amorphous-based semiconductor film is not less than 4 nm. In this case, the effect of degradation of the first electrode layer can be reliably reduced. Thus, the output characteristics of the photovoltaic cell are reliably improved.

(15)

It is preferable that the thickness of the first amorphous-based semiconductor film is not more than 8 nm. In this case, a short-circuit current of the photovoltaic cell can be prevented from being reduced.

(16)

It is preferable that the thickness of the first amorphous-based semiconductor film is not less than 3.5 nm. In this case, the photocarriers can be reliably prevented from being recombined at surface states of the crystal-based semiconductor. Thus, the output characteristics of the photovoltaic cell are further improved.

(17)

It is preferable that the thickness of the third amorphous-based semiconductor film is not less than 10 nm. In this case, the photocarriers can be reliably prevented from being recombined at surface states of the crystal-based semiconductor. Thus, the output characteristics of the photovoltaic cell are further improved.

(18)

It is preferable that the thickness of the third amorphous-based semiconductor film is not more than 20 nm. In this case, a short-circuit current of the photovoltaic cell can be prevented from being reduced.

Other features, elements, characteristics, and advantages of the present invention will become more apparent from the following description of preferred embodiments of the present invention with reference to the attached drawings.

DESCRIPTION OF THE PREFERRED EMBODIMENTS

Embodiments of the present invention will be described.

First Embodiment

Figure 1:
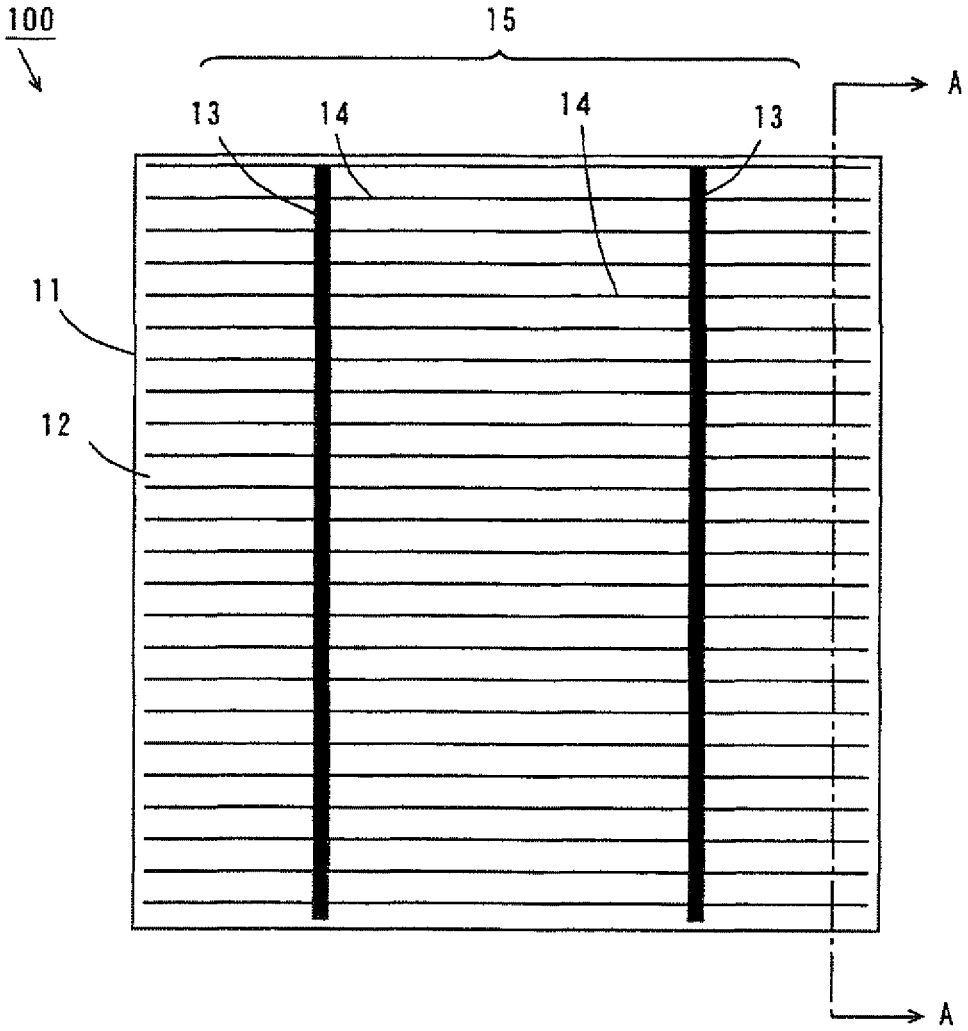
FIG. 1 is a top view of a photovoltaic cell according to a first embodiment of the present invention.
Figure 2:
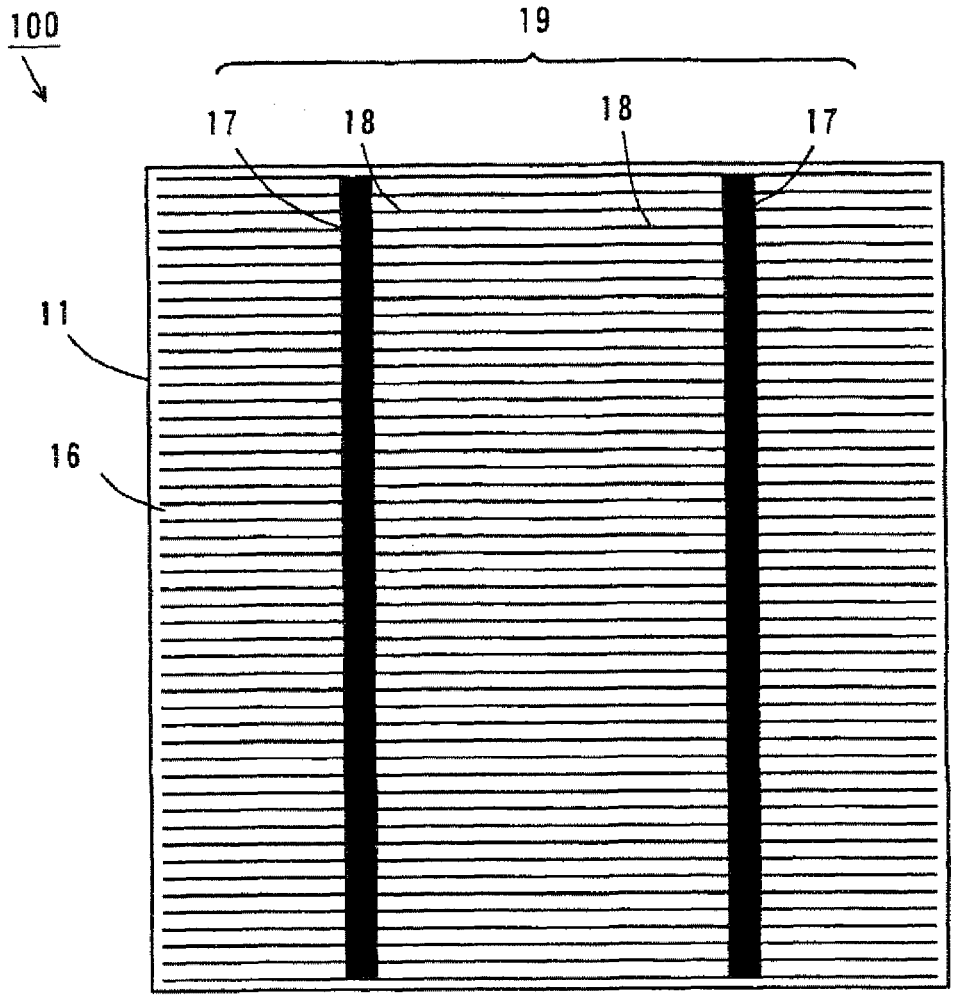
FIG. 2 is a bottom view of the photovoltaic cell according to the first embodiment of the present invention.

FIGS. 1 and 2 are respectively a top view and a bottom view of a photovoltaic cell according to a first embodiment of the present invention.

As shown in FIG. 1, a photovoltaic cell 100 comprises an n-type single crystalline silicon substrate 11 having a substantially square shape. A front electrode 12 is formed through an amorphous silicon film, described later, on a main surface (a light receiving surface) of the n-type single crystalline silicon substrate 11. A plurality of striped bus bar electrodes 13 are formed parallel to one another on the front electrode 12, and a plurality of striped finger electrodes 14 are formed parallel to one another so as to be respectively perpendicular to the bus bar electrodes 13. The bus bar electrodes 13 and the finger electrodes 14 constitute a collecting electrode. The width of the bus bar electrode 13 is 1.5 mm, for example, and the width of the finger electrode 14 is 100 μm, for example. The pitch between the finger electrodes 14 is 2 mm, for example.

As shown in FIG. 2, a back electrode 16 is formed on a back surface of the n-type single crystalline silicon substrate 11 through an amorphous silicon film, described later. A plurality of striped bus bar electrodes 17 are formed parallel to one another on the back electrode 16, and a plurality of striped finger electrodes 18 are formed parallel to one another so as to be respectively perpendicular to the bus bar electrodes 17. The bus bar electrodes 17 and the finger electrodes 18 constitute a collecting electrode 19. The width of the bus bar electrode 17 is 3 mm, for example, and the width of the finger electrode 18 is 200 μm, for example. The pitch between the finger electrodes 18 is 1 mm, for example.

The front electrode 12 and the back electrode 16 are transparent electrodes composed of ITO (indium tin oxide), $SiO_2$ (tin oxide), ZnO (zinc oxide), or the like, for example, and the collecting electrodes 15 and 19 are formed of a conductive paste including conductive particles such as Ag (silver), for example. In a case where light is incident from only the side of the front electrode 12, a metal electrode that is not transparent may be used as the back electrode 16.

Figure 3:
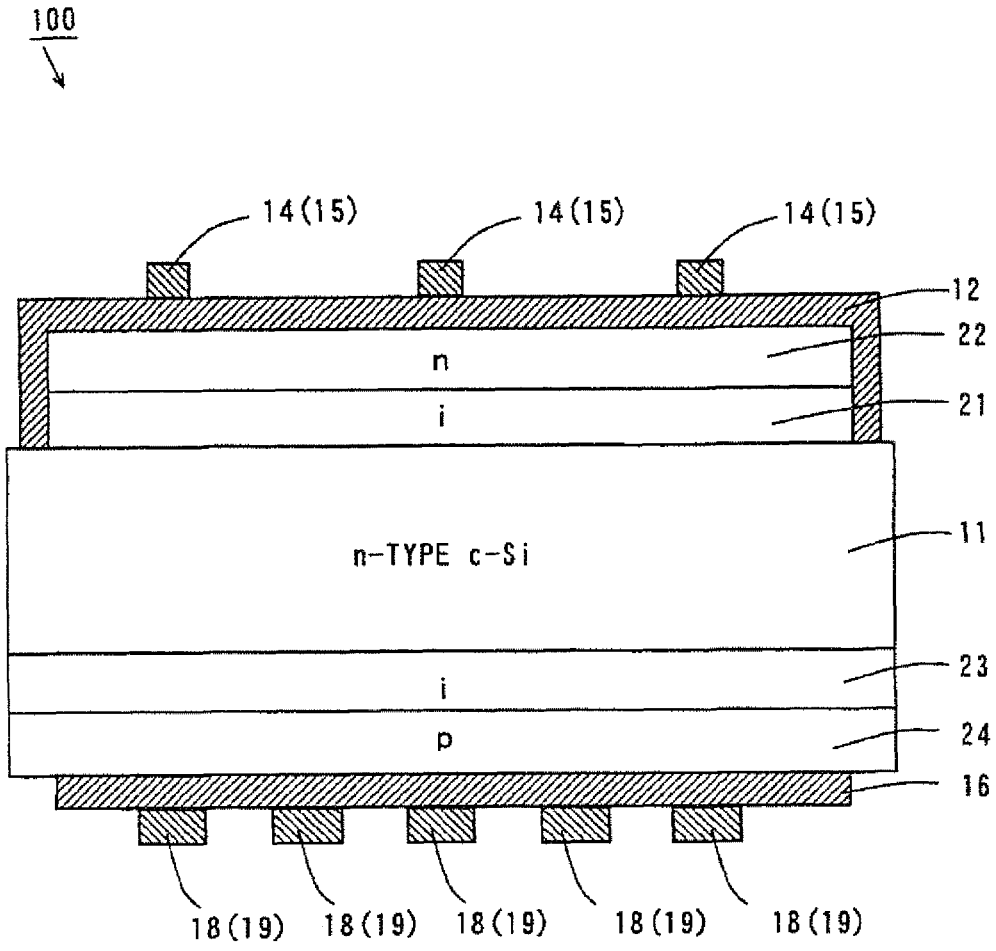
FIG. 3 is a cross-sectional view taken along a line A-A of the photovoltaic cell shown in FIG. 1.

FIG. 3 is a cross-sectional view taken along a line A-A of the photovoltaic cell 100 shown in FIG. 1.

As shown in FIG. 3, an i-type amorphous silicon film 21 (a non-doped amorphous silicon film) and an n-type amorphous silicon film 22 are formed in this order in a region excluding a predetermined width of an outer periphery on a main surface of the n-type single crystalline silicon substrate 11. Further, the front electrode 12 is formed so as to cover the i-type amorphous silicon film 21 and the n-type amorphous silicon film 22 on the main surface of the n-type single crystalline silicon substrate 11, and the collecting electrode 15 is formed on the front electrode 12. In FIG. 3, the bus bar electrodes 13 (see FIG. 1) in the collecting electrode 15 are not illustrated, and only the finger electrodes 14 in the collecting electrode 15 are illustrated.

An i-type amorphous silicon film 23 and a p-type amorphous silicon film 24 are formed on the entire area of a back surface of then-type single crystalline silicon substrate 11. Further, the back electrode 16 is formed in a region excluding a predetermined width of an outer periphery on the p-type amorphous silicon film 24, and the collecting electrode 19 is formed on the back electrode 16. In FIG. 3, the bus bar electrodes 17 (see FIG. 2) in the collecting electrode 19 are not illustrated, and only the finger electrodes 18 in the collecting electrode 19 are illustrated. In the photovoltaic cell 100, the n-type single crystalline silicon substrate 11 serves as a primary power generation layer.

Here, in the photovoltaic cell 100 according to the present embodiment, electrons generated in the n-type single crystalline silicon substrate 11 are collected by two regions that are the n-type single crystalline silicon substrate 11 and the n-type amorphous silicon film 22 doped at a high concentration. In this case, the collection efficiency of electrons by the n-type single crystalline silicon substrate 11 and the n-type amorphous silicon film 22 becomes higher, as compared with the collection efficiency of holes by the p-type amorphous silicon film 24. Even if the volume of the collecting electrode 15 is made smaller than that of the collecting electrode 19, therefore, the collection efficiency of electrons can be prevented from being made lower than the collection efficiency of holes. Thus, the bus bar electrode 13 and the finger electrode 14 can be made thinner, as compared with the bus bar electrode 17 and the finger electrode 18, and the number of finger electrodes 14 can be made smaller, as described above. As a result, the quantity of light shielded by the collecting electrode 15 can be reduced, so that light can be efficiently incident on the n-type single crystalline silicon substrate 11 through the front electrode 12. Consequently, the generation efficiency of photocarriers in the n-type single crystalline silicon substrate 11 can be improved by taking a surface, on the side of the front electrode 12, of the photovoltaic cell 100 as a primary light incidence surface.

A method of manufacturing a photovoltaic cell 100 will be then described. First, a cleaned n-type single crystalline silicon substrate 11 is heated within a vacuum chamber. Thus, water adhering to a surface of the n-type single crystalline silicon substrate 11 is removed.

$SiH_4$ (silane) gas is then introduced into the vacuum chamber, and an i-type amorphous silicon film 23 is formed on the entire area of a back surface of the n-type single crystalline silicon substrate 11 by a plasma CVD (Chemical Vapor Deposition) method. $SiH_4$ gas, $H_2$ gas, and $B_2H_6$ (diborane) gas are then introduced into the vacuum chamber, and a p-type amorphous silicon film 24 is formed on the i-type amorphous silicon film 23 by the plasma CVD method.

$SiH_4$ gas is then introduced into the vacuum chamber, and an i-type amorphous silicon film 21 is formed on a main surface of the n-type single crystalline silicon substrate 11 by the plasma CVD method. $SiH_4$ gas, $H_2$ gas, and $PH_3$ (phosphine) gas are then introduced into the vacuum chamber, and an n-type amorphous silicon film 22 is formed on the i-type amorphous silicon film 21 by the plasma CVD method. Here, the i-type amorphous silicon film 21 and the n-type amorphous silicon film 22 are formed in a region excluding a predetermined width of an outer periphery on the main surface of the n-type single crystalline silicon substrate 11 by arranging a metal mask in a region with the predetermined width of the outer periphery of the n-type single crystalline silicon substrate 11. Thus, respective parts of the i-type amorphous silicon film 21 and the p-type amorphous silicon film 22 can be prevented from being detoured around a side surface of the n-type single crystalline silicon substrate 11. In the present embodiment, the i-type amorphous silicon film 21 and the n-type amorphous silicon film 22 are respectively formed in regions excluding a width of 2 mm in the outer periphery of the n-type single crystalline silicon substrate 11, for example.

Then, a back electrode 16 is formed on the p-type amorphous silicon film 24 by a sputtering method, and a front electrode 12 is formed so as to cover the i-type amorphous silicon film 21 and the n-type amorphous silicon film 22 on the main surface of the n-type single crystalline silicon substrate 11.

The front electrode 12 is formed up to the vicinity of an end of the main surface of the n-type single crystalline silicon substrate 11 by using a metal mask. Here, the sputtering method more easily controls a film formation region at the time of film formation, as compared with the plasma CVD method. Even when the front electrode 12 is formed up to the vicinity of the end of the main surface of the n-type single crystalline silicon substrate 11, as described above, the front electrode 12 can be prevented from being formed up to the side surface of the n-type single crystalline silicon substrate 11.

The back electrode 16 is formed in a region excluding a predetermined width of an outer periphery of the p-type amorphous silicon film 24 by arranging a metal mask in a region with the predetermined width of the outer periphery of the p-type amorphous silicon film 24. In the present embodiment, the back electrode 16 is formed in a region smaller than a region where the front electrode 12 is formed on the n-type single crystalline silicon substrate 11. In this case, the back electrode 16 can be reliably prevented from being formed up to the side surface of the n-type single crystalline silicon substrate 11 when it is formed.

Finally, a collecting electrode 15 and a collecting electrode 19 are respectively formed on the front electrode 12 and the back electrode 16 by a screen printing method.

As described in the foregoing, in the photovoltaic cell 100 according to the present embodiment, the i-type amorphous silicon film 21 and the n-type amorphous silicon film 22 are respectively formed in the regions excluding the predetermined width of the outer periphery on the n-type single crystalline silicon substrate 11. Even if respective parts of the i-type amorphous silicon film 23 and the p-type amorphous silicon film 24 are detoured around the side surface of the n-type single crystalline silicon substrate 11 at the time of film formation, therefore, the n-type amorphous silicon film 22 and the p-type amorphous silicon film 24 can be prevented from coming into contact with each other. Thus, a leak current can be prevented from being generated.

The front electrode 12 is formed by the sputtering method, so that the front electrode 12 is prevented from being formed up to the side surface of the n-type single crystalline silicon substrate 11. Thus, the front electrode 12 and the p-type amorphous silicon film 24 are prevented from coming into contact with each other, so that a leak current can be prevented from being generated.

The back electrode 16 is formed in a region smaller than the front electrode 12, so that the back electrode 16 can be prevented from being formed up to the side surface of the n-type single crystalline silicon substrate 11 when it is formed. Even if the front electrode 12 is formed up to the side surface of the n-type single crystalline silicon substrate 11 when it is formed, therefore, the front electrode 12 and the back electrode 16 can be reliably prevented from coming into contact with each other. Thus, a leak current can be prevented from being generated.

The front electrode 12 is formed in a region having no amorphous silicon film formed therein on the main surface of the n-type single crystalline silicon substrate 11. In this case, photocarriers generated in the region having no amorphous silicon film formed therein on the n-type single crystalline silicon substrate 11 can be moved to the front electrode 12. Thus, photocarriers that are recombined to disappear in the region having no amorphous silicon film formed therein in the n-type single crystalline silicon substrate 11 can be reduced. As a result, an output current of the photovoltaic cell 100 is improved.

Since the area of the collecting electrode 15 is small, the front electrode 12 can receive light efficiently. In this embodiment, a surface on the side of the front electrode 12 is used as a primary light incidence surface, so that the generation efficiency of photocarriers can be further improved.

It is preferable that the thickness of the i-type amorphous silicon film 21 is not more than 8 nm. Thus, a short-circuit current of the photovoltaic cell 100 can be prevented from being reduced. It is preferable that the thickness of the i-type amorphous silicon film 21 is not less than 3.5 nm. Thus, photocarriers can be prevented from being recombined at surface states of the n-type single crystalline silicon substrate 11. Therefore, it is preferable that the thickness of the i-type amorphous silicon film 21 is not less than 3.5 nm nor more than 8 nm.

It is preferable that the thickness of the n-type amorphous silicon film 22 is not more than 8 nm. Thus, the absorption loss of light by the n-type amorphous silicon film 22 can be reduced. It is preferable that the thickness of the n-type amorphous silicon film 22 is not less than 2 nm. In this case, even if the surface of the n-type amorphous silicon film 22 is degraded in forming the front electrode 12 by the sputtering method, the n-type amorphous silicon film 22 has a sufficient thickness, so that the effect of the degradation can be reduced. It is more preferable that the thickness of the n-type amorphous silicon film 22 is not less than 4 nm. Thus, the effect of the degradation on the surface of the n-type amorphous silicon film 22 can be reliably reduced. Therefore, the thickness of the n-type amorphous silicon film 22 is preferably not less than 2 nm nor more than 8 nm, and more preferably not less than 4 nm nor more than 8 nm.

It is preferable that the thickness of the i-type amorphous silicon film 23 is not less than 10 nm. Thus, photocarriers can be prevented from being recombined at surface states of the n-type single crystalline silicon substrate 11. It is preferable that the thickness of the i-type amorphous silicon film 23 is not more than 20 nm. Thus, a short-circuit current of the photovoltaic cell 100 can be prevented from being reduced. Therefore, it is preferable that the thickness of the i-type amorphous silicon film 23 is not less than 10 nm nor more than 20 nm.

It is preferable that the thickness of the p-type amorphous silicon film 24 is not less than 6 nm. Here, in the photovoltaic cell 100 according to the present embodiment, the surface on the side of the front electrode 12 is used as a primary light incidence surface. In this case, even if the thickness of the p-type amorphous silicon film 24 is increased, the quantity of light incident on the n-type single crystalline silicon substrate 11 from the side of the front electrode 12 is not reduced. Even when the thickness of the p-type amorphous silicon film 24 is set to not less than 6 nm, therefore, the quantity of light received by the n-type single crystalline silicon substrate 11 can be prevented from being reduced. Thus, the extraction efficiency of carriers can be improved while preventing the generation efficiency of photocarriers in the n-type single crystalline silicon substrate 11 from being reduced. Even if the surface of the p-type amorphous silicon film 24 is degraded in forming the back electrode 16 by sputtering, the p-type amorphous silicon film 24 has a sufficient thickness, so that the effect thereof can be reduced.

It is preferable that the thickness of the p-type amorphous silicon film 24 is not less than 15 nm. In this case, the effect of degradation on the surface of the p-type amorphous silicon film 24 can be reliably reduced.

It is preferable that the thickness of the p-type amorphous silicon film 24 is not more than 80 nm. In this case, the absorption loss of light by the p-type amorphous silicon film 24 can be reduced. Therefore, the respective quantities of light incident on the n-type single crystalline silicon substrate 11 from the side of the back electrode 16 and light incident on the n-type single crystalline silicon substrate 11 by being reflected on the back electrode 16 after being incident from the side of the front electrode 12 can be prevented from being reduced.

It is more preferable that the thickness of the p-type amorphous silicon film 24 is not more than 40 nm. In this case, the absorption loss of light by the p-type amorphous silicon film 24 can be reliably reduced. Thus, the respective quantities of light incident on the n-type single crystalline silicon substrate 11 from the side of the back electrode 16 and light incident on the n-type single crystalline silicon substrate 11 by being reflected on the back electrode 16 after being incident from the side of the front electrode 12 can be reliably prevented from being reduced. Consequently, the thickness of the p-type amorphous silicon film 24 is preferably not less than 6 nm nor more than 80 nm, and more preferably not less than 15 nm nor more than 40 nm.

As a result of these, the output characteristics of the photovoltaic cell 100 can be improved.

Second Embodiment

Figure 4:
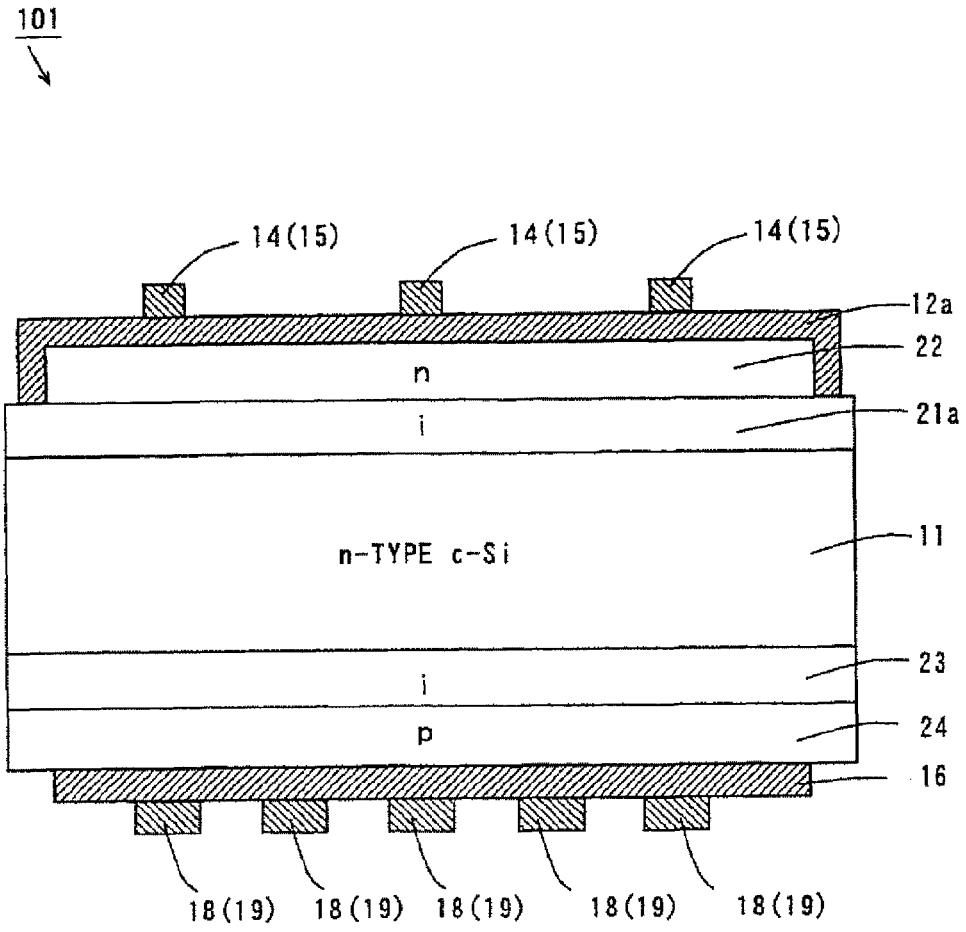
FIG. 4 is a schematic sectional view showing the configuration of a photovoltaic cell according to a second embodiment of the present invention.

FIG. 4 is a schematic sectional view showing the configuration of a photovoltaic cell according to a second embodiment of the present invention.

A photovoltaic device 101 shown in FIG. 4 is the same as the photovoltaic cell 100 shown in FIG. 3 except for the following.

As shown in FIG. 4, in the photovoltaic cell 101, an i-type amorphous silicon film 21a is formed on the entire area of a main surface of an n-type single crystalline silicon substrate 11, and an n-type amorphous silicon film 22 is formed in a region excluding a predetermined width of an outer periphery on the i-type amorphous silicon film 21a, as in the photovoltaic cell 100 shown in FIG. 3. Further, a front electrode 12a is formed so as to cover the n-type amorphous silicon film 22 on the i-type amorphous silicon film 21a.

The front electrode 12a is formed by a sputtering method using a metal mask, similarly to the front electrode 12 shown in FIG. 3, so that the front electrode 12a is prevented from being formed up to a side surface of the n-type single crystalline silicon substrate 11. This prevents the front electrode 12a and a p-type amorphous silicon film 24 from coming into contact with each other, so that a leak current can be prevented from being generated.

In the present embodiment, the i-type amorphous silicon film 21a is formed on the entire area of the main surface of the n-type single crystal silicon film 11. This prevents photocarriers from being recombined at an end on the main surface of the n-type single crystalline silicon substrate 11.

Furthermore, the front electrode 12a is formed so as to cover the n-type amorphous silicon film 22 on the i-type amorphous silicon film 21a. In this case, the photocarriers at the end of the i-type amorphous silicon film 21a can be moved to the front electrode 12a. Thus, the photocarriers that are recombined to disappear at the end of the i-type amorphous silicon film 21a can be reduced.

As a result of these, the output characteristics of the photovoltaic cell 101 can be further improved.

Another Embodiment

Although in the above-mentioned embodiments, the n-type single crystalline silicon substrate 11 is used as a crystal-based semiconductor substrate, the present invention is not limited to the same. For example, the n-type single crystalline silicon substrate 11 may be replaced with an n-type polycrystalline silicon substrate, a p-type single crystalline silicon substrate, or a p-type polycrystalline silicon substrate.

In a case where the p-type single crystalline silicon substrate or the p-type microcrystalline silicon substrate is used, a p-type amorphous silicon film and an n-type amorphous silicon film are respectively provided in place of the n-type amorphous silicon film 22 and the p-type amorphous silicon film 24 shown in FIGS. 3 and 4. Thus, the same effect as those in the above-mentioned embodiments can be obtained.

The i-type amorphous silicon films 21 and 21a, the n-type amorphous silicon film 22, and the p-type amorphous silicon film 24 may include microcrystalline silicon.

Although in the above-mentioned embodiments, silicon is used as a material for the crystal-based semiconductor and the amorphous-based semiconductor film, the present invention is not limited to the same. For example, other Group IV elements such as SiC (silicon carbide), SiGe (silicon germanium), and Ge (germanium) may be used.

(Correspondences Between Elements in Claims and Units in Embodiments)

In the following paragraphs, non-limiting examples of correspondences between various elements recited in the claims below and those described above with respect to various preferred embodiments of the present invention are explained. In the embodiment described above, the n-type single crystalline silicon substrate 11 corresponds to a crystal-based semiconductor of one conductivity type, the i-type amorphous silicon films 21 and 21a correspond to a first amorphous-based semiconductor film, the n-type amorphous silicon film 22 corresponds to a second amorphous-based semiconductor film, the front electrodes 12 and 12a correspond to a first electrode layer, the i-type amorphous silicon film 23 corresponds to a third amorphous-based semiconductor film, the p-type amorphous silicon film 24 corresponds to a fourth amorphous-based semiconductor film, and the back electrode 16 corresponds to a second electrode layer.

EXAMPLES

Photovoltaic cells in inventive examples and comparative examples were formed, to measure the output characteristics of each of the formed photovoltaic cells. The effect of the shape and the thickness of an amorphous silicon film on the output characteristics was evaluated.

(1) Effect of Shape of Amorphous Silicon Film on Output Characteristics

First, the effect of the shape of an amorphous silicon film on output characteristics was evaluated.

Inventive Example 1

In an inventive example 1, the photovoltaic cell 100 shown in FIG. 3 was fanned by the method according to the first embodiment. Table 1 shows the formation conditions of the photovoltaic cell 100 in the inventive example 1. The respective formation conditions of an i-type amorphous silicon film, an n-type amorphous silicon film, and a p-type amorphous silicon film in an inventive example 2 and comparative examples 1 to 6, described later, are the same.

TABLE 1

| Processing | Formation Conditions: Substrate Temperature [° C.] | Used Gas [sccm] | Pressure [Pa] | Power Density [mW/cm$^2$] |
|---|---|---|---|---|
| Main Surface | | | | |
| i-Type Amorphous Silicon Film | 170 | $SiH_4$: 40 $H_2$: 0~100 | 40 | 8.33 |
| n-Type Amorphous Silicon Film | 170 | $SiH_4$: 40, $PH_3$(1%); 40 | 40 | 8.33 |
| Back Surface | | | | |
| i-Type Amorphous Silicon Film | 170 | $SiH_4$: 40, $H_2$: 0~100 | 40 | 8.33 |
| p-Type Amorphous Silicon Film | 170 | $SiH_4$: 40, $B_2H_6$(2%): 40 | 40 | 8.33 |

Light was incident from the side of a front electrode 12 in the formed photovoltaic cell 100, to measure the output characteristics thereof. As a result, an open voltage Voc was 0.703V, a short-circuit current Isc was 3.679 A, a fill factor F.F. was 0.809, and the maximum power Pmax was 2.092.

Inventive Example 2

In an inventive example 2, the photovoltaic cell 101 shown in FIG. 4 was formed by the method according to the second embodiment.

Light was incident from the side of a front electrode 12a in the formed photovoltaic cell 101, to measure the output characteristics thereof. As a result, an open voltage Voc was 0.705V, a short-circuit current Isc was 3.701 A, a fill factor F.F. was 0.815, and the maximum power Pmax was 2.127.

Comparative Example 1

Figure 5:
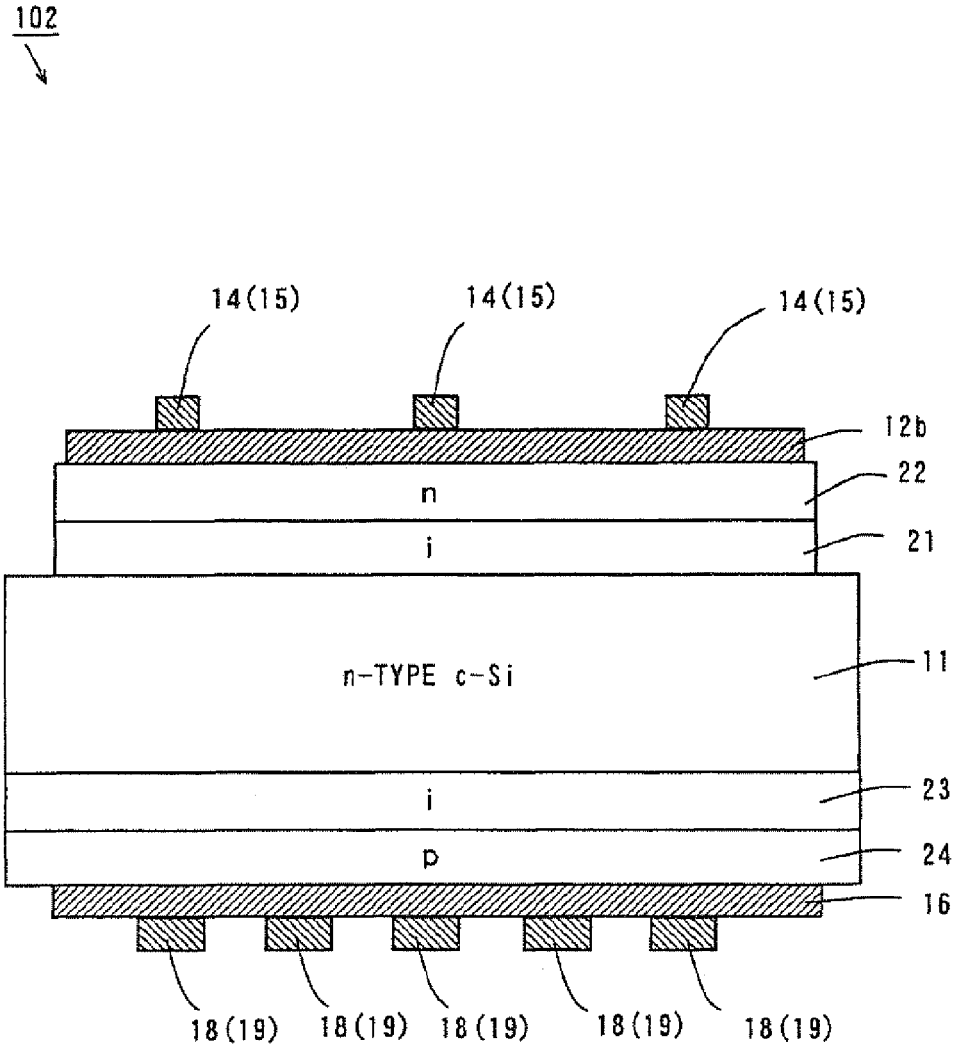
FIG. 5 is a schematic sectional view showing the configuration of a photovoltaic cell in a comparative example 1.

FIG. 5 is a schematic sectional view showing the configuration of a photovoltaic cell in a comparative example 1.

A photovoltaic cell 102 shown in FIG. 5 is the same as the photovoltaic cell 100 shown in FIG. 1 except for the following.

As shown in FIG. 5, in the photovoltaic cell 102, an i-type amorphous silicon film 21 and an n-type amorphous silicon film 22 were not covered with a front electrode, and a front electrode 12b was formed in a region excluding a predetermined width of an outer periphery on the n-type amorphous silicon film 22.

Light was incident from the side of the front electrode 12b in the formed photovoltaic cell 102, to measure the output characteristics thereof. As a result, an open voltage Voc was 0.703V, a short-circuit current Isc was 3.596 A, a fill factor F.F. was 0.796, and the maximum power Pmax was 2.012.

Comparative Example 2

In a comparative example 2, light was incident from the side of a back electrode 16 in a photovoltaic cell 102 having the same configuration as that in the comparative example 1, to measure the output characteristics thereof. As a result, an open voltage Voc was 0.704V, a short-circuit current Isc was 3.752A, a fill factor F.F. was 0.771, and the maximum power Pmax was 2.037. In the comparative example 2, each of amorphous silicon films in the photovoltaic cell 102 was formed to a thickness most suitable for light incidence from the side of the back electrode 16.

Comparative Example 3

Figure 6:
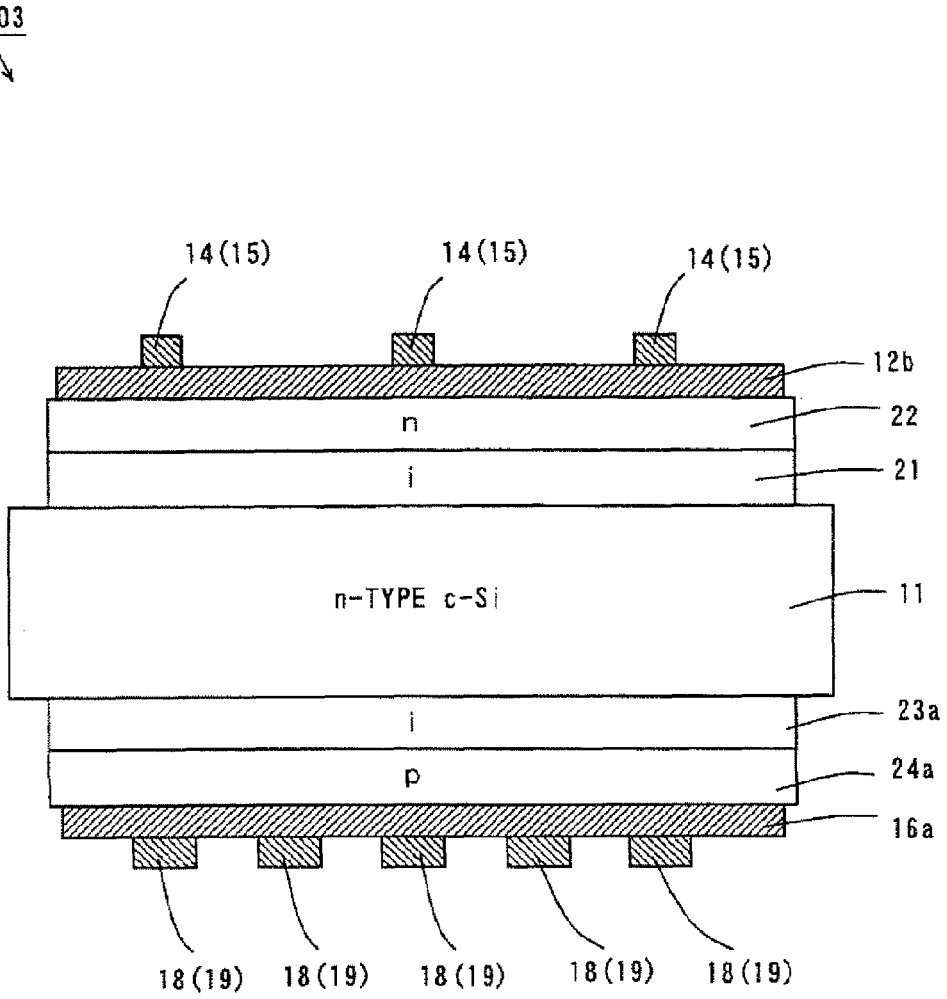
FIG. 6 is a schematic sectional view showing the configuration of a photovoltaic cell in a comparative example 3.

FIG. 6 is a schematic sectional view showing the configuration of a photovoltaic cell in a comparative example 3.

A photovoltaic cell 103 shown in FIG. 6 is the same as the photovoltaic cell 102 shown in FIG. 5 except for the following.

As shown in FIG. 6, in the photovoltaic cell 103, an i-type amorphous silicon film 23a and a p-type amorphous silicon film 24a were formed on a back surface of an n-type single crystalline silicon substrate 11 in the same region as a region where an i-type amorphous silicon film 21 and an n-type amorphous silicon film 22 were formed, and a back electrode 16a was formed on the p-type amorphous silicon film 24a.

Light was incident from the side of a front electrode 12b in the formed photovoltaic cell 103, to measure the output characteristics thereof. As a result, an open voltage Voc was 0.704V, a short-circuit current Isc was 3.601 A, a fill factor F.F. was 0.811, and the maximum power Pmax was 2.056.

Comparative Example 4

In a comparative example 4, light was incident from the side of a back electrode 16a in a photovoltaic cell 103 having the same configuration as that in the comparative example 3, to measure the output characteristics thereof. As a result, an open voltage Voc was 0.704V, a short-circuit current Isc was 3.642 A, a fill factor F.F. was 0.774, and the maximum power Pmax was 1.985. In the comparative example 4, each of amorphous silicon films in the photovoltaic cell 103 was formed to a thickness most suitable for light incidence from the side of the back electrode 16a.

Comparative Example 5

Figure 7:
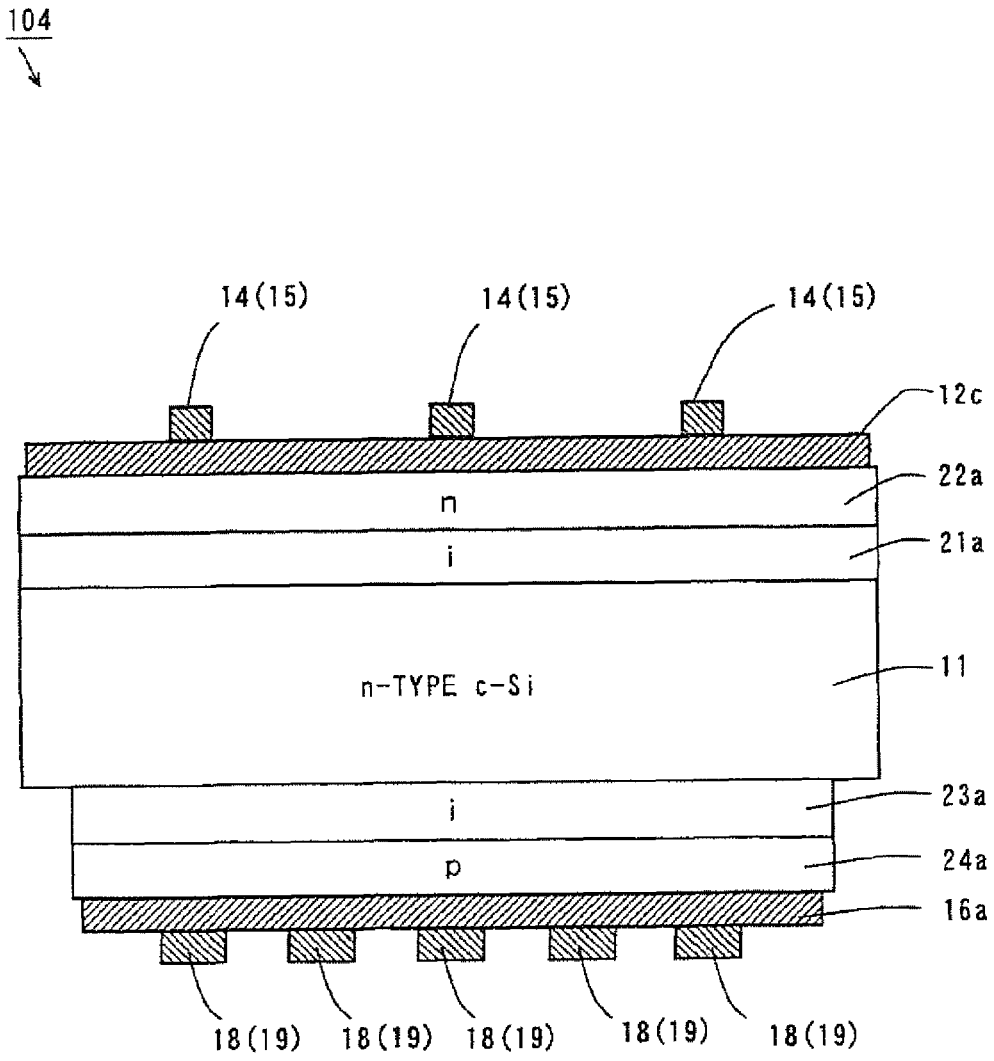
FIG. 7 is a schematic sectional view showing the configuration of a photovoltaic cell in a comparative example 5.

FIG. 7 is a schematic sectional view showing the configuration of a photovoltaic cell in a comparative example 5.

A photovoltaic cell 104 shown in FIG. 7 is the same as the photovoltaic cell 103 shown in FIG. 6 except for the following.

As shown in FIG. 7, in the photovoltaic cell 104, an i-type amorphous silicon film 21a and an n-type amorphous silicon film 22a were formed on the entire area of a main surface of an n-type single crystalline silicon substrate 11, and a front electrode 12c was formed on the n-type amorphous silicon film 22a.

Light was incident from the side of the front electrode 12c in the formed photovoltaic cell 104, to measure the output characteristics thereof. As a result, an open voltage Voc was 0.701V, a short-circuit current Isc was 3.580 A, a fill factor F.F. was 0.801, and the maximum power Pmax was 2.010.

Comparative Example 6

Figure 8:
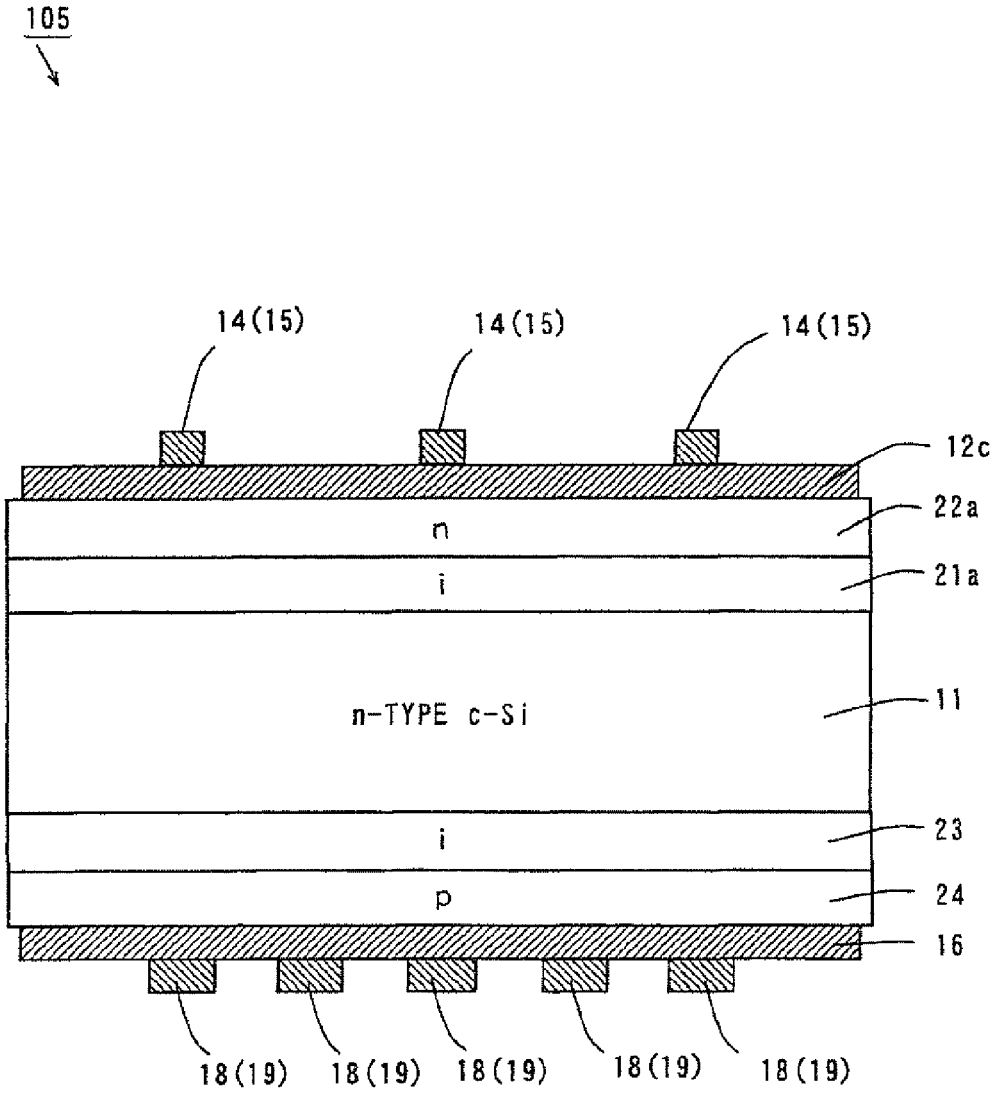
FIG. 8 is a schematic sectional view showing the configuration of a photovoltaic cell in a comparative example 6.

FIG. 8 is a schematic sectional view showing the configuration of a photovoltaic cell in a comparative example 6.

A photovoltaic cell 105 shown in FIG. 8 is the same as the photovoltaic cell 100 shown in FIG. 3 except for the following.

As shown in FIG. 8, in the photovoltaic cell 105, an i-type amorphous silicon film 21a and an n-type amorphous silicon film 22a were formed on the entire area of a main surface of an n-type single crystalline silicon substrate 11, and a front electrode 12c was formed on the n-type amorphous silicon film 22a.

Light was incident from the side of the front electrode 12c in the formed photovoltaic cell 105, to measure the output characteristics thereof. As a result, an open voltage Voc was 0.695V, a short-circuit current Isc was 3.728 A, a fill factor F.F. was 0.626, and the maximum power Pmax was 1.621.

(Evaluation of Results of Measurement)

Table 2 shows the results of the measurement of the output characteristics of the photovoltaic cells in the inventive examples 1 and 2 and the comparative examples 1 to 6.

TABLE 2

| | Voc [V] | Isc [A] | FF | Pmax [W] |
|---|---|---|---|---|
| Inventive Example 1 | 0.703 | 3.679 | 0.809 | 2.092 |
| Inventive Example 2 | 0.705 | 3.701 | 0.815 | 2.127 |
| Comparative Example 1 | 0.703 | 3.596 | 0.796 | 2.012 |
| Comparative Example 2 | 0.704 | 3.752 | 0.771 | 2.037 |
| Comparative Example 3 | 0.704 | 3.601 | 0.811 | 2.056 |
| Comparative Example 4 | 0.704 | 3.642 | 0.774 | 1.985 |
| Comparative Example 5 | 0.701 | 3.580 | 0.801 | 2.010 |
| Comparative Example 6 | 0.695 | 3.728 | 0.626 | 1.621 |

(a) Evaluation of inventive Example 1 and Comparative Example 1

As shown in Table 2, the short-circuit current Isc, the fill factor F.F., and the maximum power Pmax of the photovoltaic cell 100 in the inventive example 1 were improved, as compared with those of the photovoltaic cell 102 in the comparative example 1.

In the photovoltaic cell 100 in the inventive example 1, the front electrode 12 is formed on the main surface of the n-type single crystalline silicon substrate 11 so as to almost cover the i-type amorphous silicon film 21 and the n-type amorphous silicon film 22 and the outer periphery on the main surface of then-type single crystalline silicon substrate 11, as shown in FIG. 3. In this case, the photocarriers generated in the region having no amorphous silicon film formed therein on the n-type single crystalline silicon substrate 11 can be moved to the front electrode 12. Thus, the photocarriers that are recombined to disappear in the region having no amorphous silicon film formed therein on the n-type single crystalline silicon substrate 11 can be reduced. As a result, it is considered that the output characteristics of the photovoltaic cell 100 in the inventive example 1 were improved.

On the other hand, in the photovoltaic cell 102 in the comparative example 1, the front electrode 12b is not formed in the portion having no amorphous silicon film formed therein at the end of the main surface of the n-type single crystalline silicon substrate 11, as shown in FIG. 5. In this case, the photocarriers generated in the portion having no amorphous silicon film formed therein at the end on the main surface of the n-type single crystalline silicon substrate 11 disappear by recombination. Thus, it is considered that the output characteristics of the photovoltaic cell 102 in the comparative example 1 were deteriorated, as compared with those of the photovoltaic cell 100 in the inventive example 1.

(b) Evaluation of Inventive Example 2

As shown in Table 2, the output characteristics of the photovoltaic cell 101 in the inventive example 2 are improved, as compared with those of the photovoltaic cell 100 in the inventive example 1.

In the inventive example 2, the i-type amorphous silicon film 21a is formed on the entire area of the main surface of the n-type single crystalline silicon substrate 11, and the front electrode 12a is formed so as to almost cover the n-type amorphous silicon film 22 and the outer periphery of the i-type amorphous silicon film 21a on the i-type amorphous silicon film 21a, as shown in FIG. 4.

In this case, the photocarriers at the end of the i-type amorphous silicon film 21a can be moved to the front electrode 12a. Thus, the photocarriers that are recombined to disappear at the end of the i-type amorphous silicon film 21a can be reduced.

Since the i-type amorphous silicon film 21a is formed on the entire area of the main surface of the n-type single crystal silicon film 11, the photocarriers are prevented from being recombined at the end on the main surface of the n-type single crystalline silicon substrate 11.

As a result of these, it is considered that the output characteristics of the photovoltaic cell 101 in the inventive example 2 were further improved.

(c) Evaluation of Comparative Example 2

As shown in Table 2, the fill factor F.F. and the maximum power Pmax in the comparative example 2 are made lower, as compared with those in the inventive examples 1 and 2, as in the comparative example 1. This has shown that according to the configuration of the photovoltaic cell 102 shown in FIG. 5, even if light is incident from the side of the front electrode 12b or is incident from the side of the back electrode 16, the fill factor F.F. and the maximum power Pmax are deteriorated, as compared with those in the inventive examples 1 and 2.

Particularly, the fill factor F.F. in the comparative example 2 is made lower, as compared with those in the inventive examples 1 and 2 and the comparative example 1. This has shown that the fill factor F.F. is improved by taking a surface, on the side of the n-type amorphous silicon film 22, of the photovoltaic cell as a light incidence surface.

(d) Evaluation of Comparative Example 3 and Comparative Example 4

As shown in Table 2, the short-circuit current Isc and the maximum power Pmax in the comparative examples 3 and 4 are made lower, as compared with those in the inventive examples 1 and 2.

In the comparative examples 3 and 4, the front electrode 12b and the back electrode 16a are not formed in the portion having no amorphous silicon film formed therein at the respective ends on both the surfaces of the n-type single crystalline silicon substrate 11, as shown in FIG. 6. In this case, the photocarriers generated in the region having no amorphous silicon film formed therein at the ends of the n-type single crystalline silicon substrate 11 disappear by recombination. Consequently, it is considered that the output characteristics were deteriorated.

Particularly, the fill factor F.F. in the comparative example 4 is made lower, as compared with those in the inventive examples 1 and 2 and the comparative example 3. This has shown that the fill factor F.F. is improved by taking a surface, on the side of the n-type amorphous silicon film 22, of the photovoltaic cell as a light incidence surface.

(e) Evaluation of Comparative Example 5

As shown in Table 2, the output characteristics in the comparative example 5 are deteriorated, as compared with those in the inventive examples 1 and 2.

Although in the comparative example 5, the amorphous silicon film is formed on almost the entire area of the main surface of the n-type single crystalline silicon substrate 11, as shown in FIG. 7, the region of the amorphous silicon film formed on the back surface of the n-type single crystalline silicon substrate 11 is smaller, as compared with the photovoltaic cells 100 and 101 shown in FIGS. 3 and 4. In this case, the area of the pin junction is reduced, so that the amount of generation of the photocarriers is reduced. Consequently, it is considered that the output characteristics of the photovoltaic cell 104 in the comparative example 5 were deteriorated.

(f) Evaluation of Comparative Example 6

As shown in Table 2, the open voltage Voc, the fill factor F.F. and the maximum power Pmax in the comparative example 6 are made lower, as compared with those in the inventive examples 1 and 2.

In the comparative example 6, the amorphous silicon films are respectively formed on almost the entire areas of both the surfaces of the n-type single crystalline silicon substrate 11, as shown in FIG. 8. In this case, the photocarriers can be prevented from being recombined at the end on the surface of the n-type single crystalline silicon substrate 11, while a part of the n-type amorphous silicon film 22a and a part of the p-type amorphous silicon film 24 are detoured around the side surface of the n-type single crystalline silicon substrate 11 to come into contact therewith. Thus, a leak current is generated, so that it is considered that the output characteristics were deteriorated.

(2) Effect of Thickness of Amorphous Silicon Film on Output Characteristics

The effect of the thickness of the amorphous silicon film on the output characteristics is then evaluated. Here, in the following evaluation, various types of photovoltaic cells respectively comprising amorphous silicon films that differ in thickness were formed in the same configuration as that of the photovoltaic cell 105 shown in FIG. 8. Light was incident from the side of the front electrode 12c and the side of the back electrode 16 in each of the photovoltaic cells, to measure the maximum power Pmax thereof.

(Evaluation)

Figure 9:
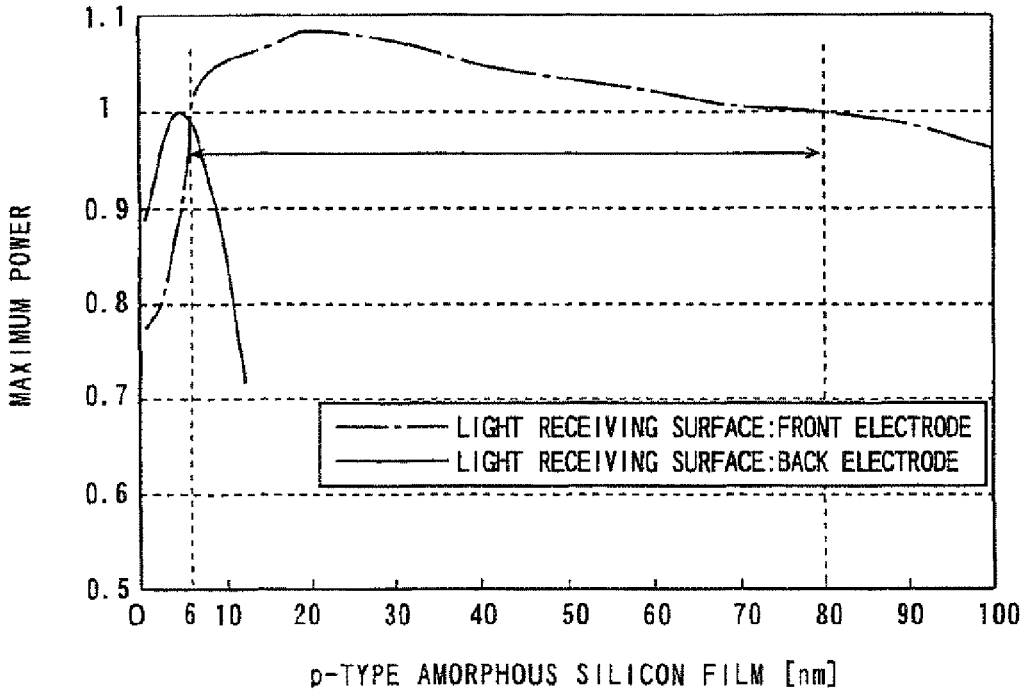
FIG. 9 is a diagram showing the relationship between the thickness of a p-type amorphous silicon film and the maximum power Pmax.

(a) Relationship Between Thickness of p-Type Amorphous Silicon Film and Maximum Power Pmax Various types of photovoltaic cells respectively comprising p-type amorphous silicon films 24 that differ in thickness were formed, to measure the maximum power Pmax of each of the photovoltaic cells. FIG. 9 shows the results of the measurement. In FIG. 9, the horizontal axis indicates the thickness of the p-type amorphous silicon film 24, and the vertical axis indicates the maximum power Pmax. A one-dot and dash line indicates the results of measurement of the photovoltaic cell comprising the front electrode 12c serving as a light incidence surface (a light receiving surface), and a solid line indicates the results of measurement of the photovoltaic cell comprising the back electrode 16 serving as a light incidence surface.

The value of the maximum power Pmax is a value standardized, letting the maximum value of the maximum power Pmax of the photovoltaic cell comprising the back electrode 16 serving as a light incidence surface be one. The thickness of the i-type amorphous silicon film 21a in the photovoltaic cell comprising the front electrode 12c serving as a light incidence surface is 5 nm, the thickness of the n-type amorphous silicon film 22a is 5 nm, and the thickness of the i-type amorphous silicon film 23 is 15 nm. Further, the thickness of the i-type amorphous silicon film 21a in the photovoltaic cell comprising the back electrode 16 serving as a light incidence surface is 15 nm, the thickness of the n-type amorphous silicon film 22a is 14 nm, and the thickness of the i-type amorphous silicon film 23 is 8 nm.

As shown in FIG. 9, in the photovoltaic cell comprising the front electrode 12c serving as a light incidence surface, when the thickness of the p-type amorphous silicon film 24 is 6 to 80 nm, the value of the maximum power Pmax exceeds the maximum value of the maximum power Pmax of the photovoltaic cell comprising the back electrode 16 serving as a light incidence surface.

Here, in the photovoltaic cell comprising the back electrode 16 serving as a light incidence surface, the p-type amorphous silicon film 24 is formed on the side of the light incidence surface. In this case, when the thickness of the p-type amorphous silicon film 24 is increased, the absorption loss of light by the p-type amorphous silicon film 24 is increased, so that the quantity of light incident on the n-type single crystalline silicon substrate 11 is reduced. Thus, the generation efficiency of photocarriers in the n-type single crystalline silicon substrate 11 is reduced.

When the thickness of the p-type amorphous silicon film 24 is reduced, the effect of the surface of the p-type amorphous silicon film 24 degraded at the time of formation of the back electrode 16 cannot be reduced, and the extraction efficiency of carriers is reduced.

On the other hand, in the photovoltaic cell comprising the front electrode 12c serving as a light incidence surface, the p-type amorphous silicon film 24 is formed on the side of the back surface of the single crystalline silicon substrate 11. That is, the p-type amorphous silicon film 24 is formed on the opposite side of the light incidence surface. In this case, even if the thickness of the p-type amorphous silicon film 24 is increased to not less than 6 nm, the quantity of light incident on the n-type single crystalline silicon substrate 11 from the side of the light incidence surface is not reduced. Thus, the thickness of the p-type amorphous silicon film 24 can be increased while preventing the quantity of light received by the n-type single crystalline silicon substrate 11 from being reduced. Consequently, the extraction efficiency of carriers can be improved while preventing the generation efficiency of photocarriers in the n-type single crystalline silicon substrate 11 from being reduced by increasing the thickness of the p-type amorphous silicon film 24.

Even if the surface of the p-type amorphous silicon film 24 is degraded at the time of formation of the back electrode 16, the effect thereof can be reduced by increasing the thickness of the p-type amorphous silicon film 24.

In a case where the thickness of the p-type amorphous silicon film 24 is not more than 80 nm, the absorption loss of light by the amorphous silicon film 24 can be reduced. This can prevent the quantity of light incident again on the n-type single crystalline silicon substrate 11 by being reflected on the back electrode 16 after passing through the n-type single crystalline silicon substrate 11 from being reduced.

As a result of these, it is considered that the maximum power Pmax of the photovoltaic cell comprising the front electrode 12c serving as a light incidence surface was improved.

Although the value of the maximum power Pmax of the photovoltaic cell comprising the back electrode 16 serving as a light incidence surface is steeply changed depending on the change in the thickness of the p-type amorphous silicon film 24, the value of the maximum power Pmax of the photovoltaic cell comprising the front electrode 12c serving as a light incidence surface is gently changed in a range in which the thickness of the p-type amorphous silicon film 24 is not less than 6 nm. That is, in the photovoltaic cell comprising the front electrode 12c serving as a light incidence surface, the range of the thickness of the p-type amorphous silicon film 24 such that the high maximum power Pmax can be obtained is large. Consequently, precision required to control the thickness is alleviated.

Figure 10:
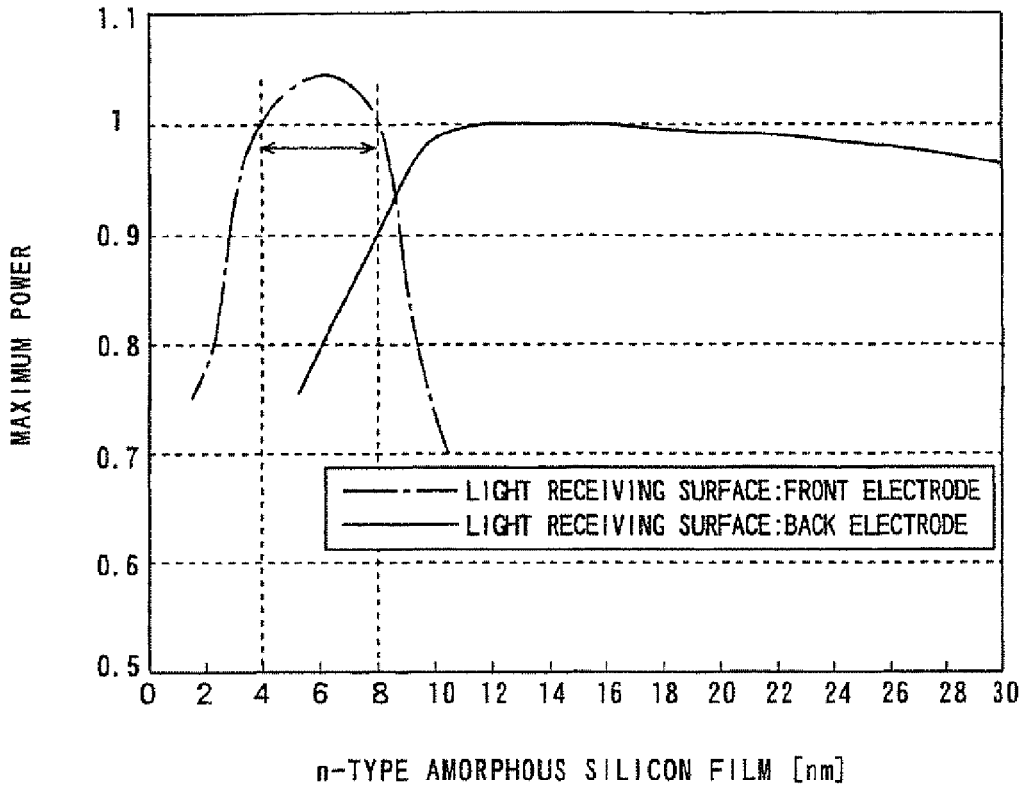
FIG. 10 is a diagram showing the relationship between the thickness of an n-type amorphous silicon film and the maximum power Pmax.

(b) Relationship Between Thickness of n-Type Amorphous Silicon Film and Maximum Power Pmax Various types of photovoltaic cells respectively comprising n-type amorphous silicon films 22a that differ in thickness were formed, to measure the maximum power Pmax of each of the photovoltaic cells. FIG. 10 shows the results of the measurement. In FIG. 10, the horizontal axis indicates the thickness of the n-type amorphous silicon film 22a, and the vertical axis indicates the maximum power Pmax. A one-dot and dash line indicates the results of the measurement of the photovoltaic cell comprising the front electrode 12c serving as a light incidence surface, and a solid line indicates the results of the measurement of the photovoltaic cell comprising the back electrode 16 serving as a light incidence surface.

The value of the maximum power Pmax is a value standardized, letting the maximum value of the maximum power Pmax of the photovoltaic cell comprising the back electrode 16 serving as a light incidence surface be one. The thickness of the i-type amorphous silicon film 21a in the photovoltaic cell comprising the front electrode 12c serving as a light incidence surface is 5 nm, the thickness of the i-type amorphous silicon film 23 is 15 nm, and the thickness of the p-type amorphous silicon film 24 is 20 nm. The thickness of the i-type amorphous silicon film 21a in the photovoltaic cell comprising the back electrode 16 serving as a light incidence surface is 15 nm, the thickness of the i-type amorphous silicon film 23 is 8 nm, and the thickness of the p-type amorphous silicon film 24 is 5 nm.

As shown in FIG. 10, in the photovoltaic cell comprising the front electrode 12c serving as a light incidence surface, when the thickness of the n-type amorphous silicon film 22a is 4 to 8 nm, the value of the maximum power Pmax exceeds the maximum value of the maximum power Pmax of the photovoltaic cell comprising the back electrode 16 serving as a light incidence surface. That is, in the photovoltaic cell comprising the front electrode 12c serving as a light incidence surface, the high maximum power Pmax can be obtained by controlling the thickness of the n-type amorphous silicon film 22a in a range of 4 to 8 nm.

Here, in the photovoltaic cell comprising the front electrode 12c serving as a light incidence surface, the n-type amorphous silicon film 22a is formed on the side of the light incidence surface. In this case, it is considered that it is possible to reduce the effect of the surface of the n-type amorphous silicon film 22a degraded at the time of formation of the front electrode 12c as well as to sufficiently reduce the absorption loss of light by the n-type amorphous silicon film 22a by setting the thickness of the n-type amorphous silicon film 22a is set to not less than 4 nm nor more than 8 nm. Consequently, it is considered that the maximum power Pmax of the photovoltaic cell comprising the front electrode 12c serving as a light incidence surface was improved.

(c) Relationship Between Thickness of i-Type Amorphous Silicon Film on Light Incidence Surface Side and Maximum Power Pmax Various types of photovoltaic cells respectively comprising i-type amorphous silicon films 21a that differ in thickness on the side of front electrodes 12c serving as light incidence surfaces and photovoltaic cells respectively comprising i-type amorphous silicon films 23 that differ in thickness on the side of back electrodes 16 serving as light incidence surfaces were formed, to measure the maximum power Pmax of each of the photovoltaic cells. That is, in this evaluation, various types of photovoltaic cells respectively comprising i-type amorphous silicon films that differ in thickness on the side of the light incidence surfaces were formed, to measure the maximum power Pmax of each of the photovoltaic cells.

Figure 11:
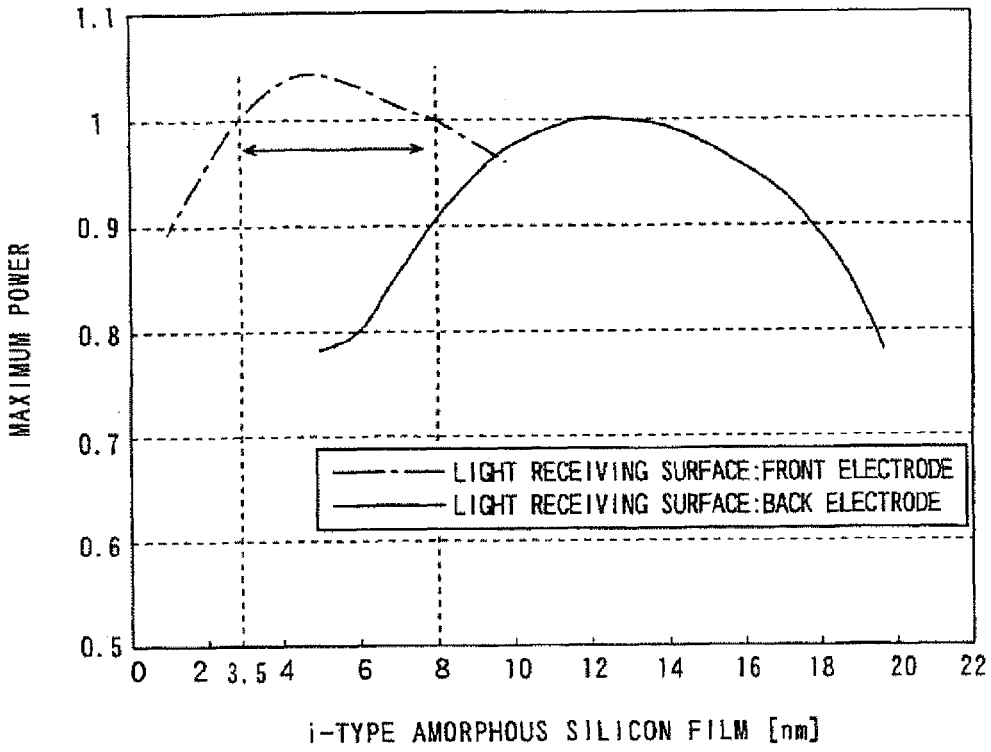
FIG. 11 is a diagram showing the relationship between the thickness of an i-type amorphous silicon film on the side of a light incidence surface and the maximum power Pmax.

FIG. 11 shows the results of the measurement. In FIG. 11, the horizontal axis indicates the thickness of the i-type amorphous silicon film 21a in the photovoltaic cell comprising the front electrode 12c serving as a light incidence surface, or the thickness of the i-type amorphous silicon film 23 in the photovoltaic cell comprising the back electrode 16 serving as a light incidence surface, that is, the thickness of the i-type amorphous silicon film on the side of the light incidence surface, and the vertical axis indicates the maximum power Pmax. A one-dot and dash line indicates the results of the measurement of the photovoltaic cell comprising the front electrode 12c serving as a light incidence surface, and a solid line indicates the results of the measurement of the photovoltaic cell comprising the back electrode 16 serving as a light incidence surface.

The value of the maximum power Pmax is a value standardized, letting the maximum value of the maximum power Pmax of the photovoltaic cell comprising the back electrode 16 serving as a light incidence surface be one. The thickness of the n-type amorphous silicon film 22a in the photovoltaic cell comprising the front electrode 12c serving as a light incidence surface is 5 nm, the thickness of the i-type amorphous silicon film 23 is 15 nm, and the thickness of the p-type amorphous silicon film 24 is 20 nm. The thickness of the i-type amorphous silicon film 21a in the photovoltaic cell comprising the back electrode 16 serving as a light incidence surface is 15 nm, the thickness of the n-type amorphous silicon film 22a is 14 nm, and the thickness of the p-type amorphous silicon film 24 is 15 nm.

As shown in FIG. 11, in the photovoltaic cell comprising the front electrode 12c serving as a light incidence surface, when the thickness of the i-type amorphous silicon film 21a is approximately 3.5 to 8 nm, the value of the maximum power Pmax exceeds the maximum value of the maximum power Pmax of the photovoltaic cell comprising the back electrode 16 serving as a light incidence surface. That is, in the photovoltaic cell comprising the front electrode 12c serving as a light incidence surface, the high maximum power Pmax can be obtained by controlling the thickness of the i-type amorphous silicon film 21a in a range of 3.5 to 8 nm.

(d) Relationship Between Thickness of i-Type Amorphous Silicon Film on Back Surface Side and Maximum Power Pmax Various types of photovoltaic cells respectively comprising i-type amorphous silicon films 23 that differ in thickness on the side of front electrodes 12c serving as light incidence surfaces and photovoltaic cells respectively comprising i-type amorphous silicon films 21a that differ in thickness on the side of back electrodes 16 serving as light incidence surfaces were formed, to measure the maximum power Pmax of each of the photovoltaic cells. That is, in this evaluation, various types of photovoltaic cells respectively comprising i-type amorphous silicon films that differ in thickness on the opposite side of the light incidence surfaces were formed, to measure the maximum power Pmax of each of the photovoltaic cells.

Figure 12:
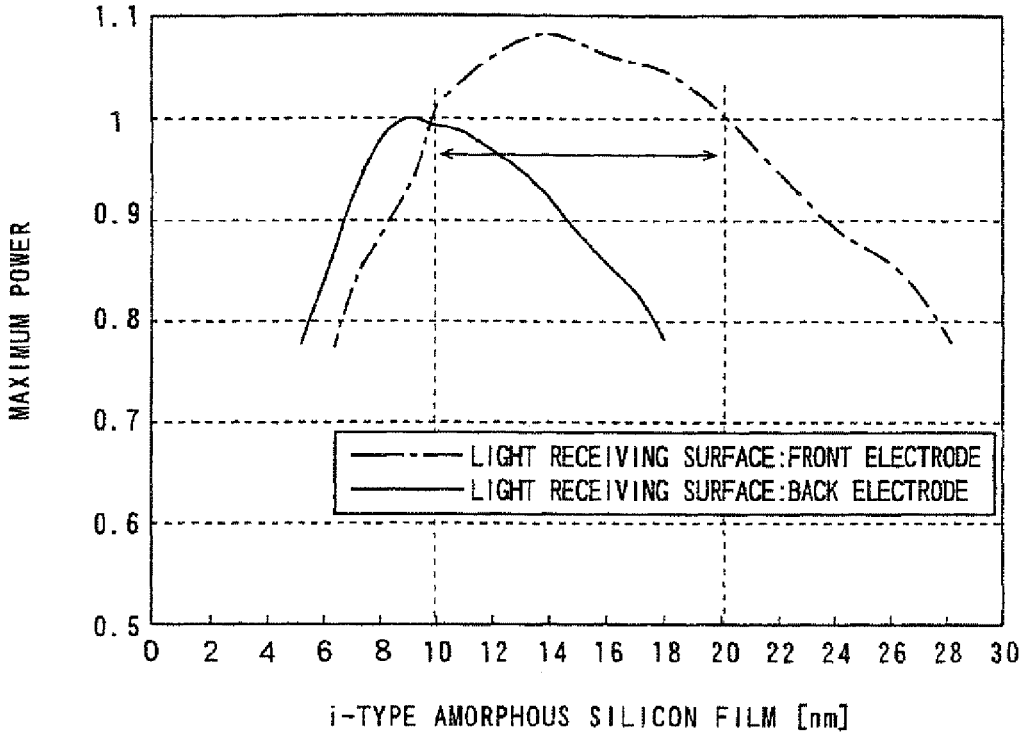
FIG. 12 is a diagram showing the relationship between the thickness of an i-type amorphous silicon film on the opposite side of a light incidence surface and the maximum power Pmax.

FIG. 12 shows the results of the measurement. In FIG. 12, the horizontal axis indicates the thickness of the i-type amorphous silicon film 23 in the photovoltaic cell comprising the front electrode 12c serving as a light incidence surface, or the thickness of the i-type amorphous silicon film 21a in the photovoltaic cell comprising the back electrode 16 serving as a light incidence surface, that is, the thickness of the i-type amorphous silicon film on the opposite side of the light incidence surface, and the vertical axis indicates the maximum power Pmax. A one-dot and dash line indicates the results of the measurement of the photovoltaic cell comprising the front electrode 12c serving as a light incidence surface, and a solid line indicates the results of the measurement of the photovoltaic cell comprising the back electrode 16 serving as a light incidence surface.

The value of the maximum power Pmax is a value standardized, letting the maximum value of the maximum power Pmax of the photovoltaic cell comprising the back electrode 16 serving as a light incidence surface be one. The thickness of the i-type amorphous silicon film 21a in the photovoltaic cell comprising the front electrode 12c serving as a light incidence surface is 5 nm, the thickness of the n-type amorphous silicon film 22a is 5 nm, and the thickness of the p-type amorphous silicon film 24 is 20 nm. The thickness of the n-type amorphous silicon film 22a in the photovoltaic cell comprising the back electrode 16 serving as a light incidence surface is 14 nm, the thickness of the i-type amorphous silicon film 23 is 8 nm, and the thickness of the p-type amorphous silicon film 24 is 5 nm.

As shown in FIG. 12, in the photovoltaic cell comprising the front electrode 12c serving as a light incidence surface, when the thickness of the i-type amorphous silicon film 23 is approximately 10 to 20 nm, the value of the maximum power Pmax exceeds the maximum value of the maximum power Pmax of the photovoltaic cell comprising the back electrode 16 serving as a light incidence surface. That is, in the photovoltaic cell comprising the front electrode 12c serving as a light incidence surface, the high maximum power Pmax can be obtained by controlling the thickness of the i-type amorphous silicon film 23 in a range of 10 to 20 nm.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A photovoltaic cell comprising:

a crystal-based semiconductor of one conductivity type;

a first substantially intrinsic amorphous-based semiconductor film formed on at least a first region of a first surface of said crystal-based semiconductor, the first region having a predetermined width and excluding an outer periphery of said first surface of said crystal based semiconductor;

a second amorphous-based semiconductor film of a conductivity type identical or opposite to said crystal-based semiconductor formed on a surface of said first substantially intrinsic amorphous-based semiconductor film and extending along said first region; and a first translucent electrode layer formed on a surface of said second amorphous-based semiconductor film, said first surface of said crystal-based semiconductor or said surface of said first amorphous-based semiconductor film being exposed from said second amorphous-based semiconductor film on said outer periphery of said crystal based semiconductor, said first electrode layer being formed on a second region covering said surface and a side surface of said second amorphous-based semiconductor film and extending over said outer periphery, said first electrode layer being in direct contact with said first surface of said crystal based semiconductor film or said surface of said first amorphous-based semiconductor film exposed from said second amorphous-based semiconductor film, on said outer periphery, and said first amorphous-based semiconductor film, said second amorphous-based semiconductor film, and said first electrode layer not formed on a side surface of said crystal based-semiconductor.

2. The photovoltaic cell according to claim 1, wherein said first amorphous-based semiconductor film is not formed on said outer periphery in said first surface of said crystal-based semiconductor film, and said first electrode layer covers said surface and said side surface of said second amorphous-based semiconductor film and is indirect contact with said first surface of said crystal-based semiconductor exposed on said outer periphery.

3. The photovoltaic cell according to claim 1, wherein said first amorphous-based semiconductor film is formed on the entire area of said first surface of said crystal-based semiconductor, and said first electrode layer covers said surface and said side surface of said second amorphous-based semiconductor film and is in direct contact with said surface of said first amorphous-based semiconductor film exposed on said outer periphery.

4. The photovoltaic cell according to claim 1, further comprising a third substantially intrinsic amorphous-based semiconductor film, and a fourth amorphous-based semiconductor film of a conductivity type opposite to said second amorphous-based semiconductor film, and a second electrode layer, said third amorphous-based semiconductor film, said fourth amorphous-based semiconductor film, and said second electrode layer being provided in this order on a second surface of said crystal-based semiconductor.

5. The photovoltaic cell according to claim 4, wherein said crystal-based semiconductor and said second amorphous-based semiconductor film are of the identical conductivity type.

6. The photovoltaic cell according to claim 4, wherein said second electrode layer is formed in a third region excluding an outer periphery with a predetermined width on said fourth amorphous-based semiconductor film.

7. The photovoltaic cell according to claim 6, wherein said third region is smaller than said second region.

8. The photovoltaic cell according to claim 4, wherein said third and fourth amorphous-based semiconductor films are respectively formed a fourth and a fifth region on said second surface of said crystal-based semiconductor film, and said fourth and fifth regions are larger than said second region.

9. The photovoltaic cell according to claim 5, wherein the thickness of said fourth amorphous-based semiconductor film is not less than 6 nm nor more than 80 nm.

10. The photovoltaic cell according to claim 9, wherein the thickness of said fourth amorphous-based semiconductor film is not more than 40 nm.

11. The photovoltaic cell according to claim 1, wherein the conductivity type of said crystal-based semiconductor is an n type.

12. The photovoltaic cell according to claim 9, wherein the thickness of said second amorphous-based semiconductor film is not less than 2 nm nor more than 8 nm.

13. The photovoltaic cell according to claim 12, wherein the thickness of said second amorphous-based semiconductor film is not less than 4 nm.

14. The photovoltaic cell according to claim 9, wherein the thickness of said first amorphous-based semiconductor film is not more than 8 nm.

15. The photovoltaic cell according to claim 14, wherein the thickness of said first amorphous-based semiconductor film is not less than 3.5 nm.

16. The photovoltaic cell according to claim 9, wherein the thickness of said third amorphous-based semiconductor film is not less than 10 nm.

17. The photovoltaic cell according to claim 16, wherein the thickness of said third amorphous-based semiconductor film is not more than 20 nm.

*18. A method of manufacturing a photovoltaic cell comprising:*

*forming an n-type amorphous-based semiconductor film on a primary light incidence surface of an n-type crystal-based semiconductor;*

*forming a first translucent electrode layer on the n-type amorphous-based semiconductor film;*

*forming a first collecting electrode on the first translucent electrode layer;*

*forming a p-type amorphous-based semiconductor film on a back surface of the n-type crystal-based semiconductor;*

*forming a second translucent electrode layer on the p-type amorphous-based semiconductor film; and*

*forming a second collecting electrode on the second translucent electrode layer, wherein:*

*the first collecting electrode includes a first bus bar electrode and a plurality of first finger electrodes extending from the first bus bar electrode, and*

*a total area where the first collecting electrode covers the first translucent electrode is smaller than a total area where the second collecting electrode covers the second translucent electrode.*

*19. The method of manufacturing a photovoltaic cell as claimed in claim 18, wherein:*

*the second collecting electrode includes a second bus bar and a plurality of second finger electrodes extending from the second bus bar, and*

*a total number of the first finger electrodes is smaller than a total number of the plurality of second finger electrode.*

*20. The method of manufacturing a photovoltaic cell as claimed in claim 18, wherein:*

*the second collecting electrode includes a second bus bar and a plurality of second finger electrodes extending from the second bus bar, and*

*a width of each of the plurality of first finger electrodes is smaller than a width of each of the plurality of second finger electrodes.*

*21. The method of manufacturing a photovoltaic cell as claimed in claim 18, wherein:*

*the first translucent electrode layer is formed in a region excluding a predetermined width of a first outer periphery of the n-type crystal-based semiconductor, and*

*the second translucent electrode layer is formed in a region excluding a predetermined width of a second outer periphery of the n-type crystal-based semiconductor.*

*22. The method of manufacturing a photovoltaic cell as claimed in claim 21, wherein:*

*the first translucent electrode layer is formed by arranging a mask in the region with a predetermined width of the first outer periphery of the n-type crystal-based semiconductor, and*

*the second translucent electrode layer is formed by arranging a mask in the region with a predetermined width of the second outer periphery of the n-type crystal-based semiconductor.*

*23. The method of manufacturing a photovoltaic cell as claimed in claim 18, wherein an exposed area of the first translucent electrode is greater than an exposed area of the second translucent electrode.*

*24. A method of manufacturing a photovoltaic cell comprising:*

*forming an n-type amorphous-based semiconductor film on a primary light incidence surface of an n-type crystal-based semiconductor;*

*forming a first translucent electrode layer on the n-type amorphous-based semiconductor film;*

*forming a first collecting electrode on the first translucent electrode layer;*

*forming a p-type amorphous-based semiconductor film on a back surface of the n-type crystal-based semiconductor;*

*forming a second translucent electrode layer on the p-type amorphous-based semiconductor film; and*

*forming a second collecting electrode on the second translucent electrode layer,*

*wherein a width of a broadest electrode pattern of the first collecting electrode is smaller than a width of a broadest electrode pattern of the second collecting electrode.*

*25. The method of manufacturing a photovoltaic cell as claimed in claim 24, wherein:*

*the first collecting electrode includes a first bus bar electrode and a plurality of first finger electrodes extending from the first bus bar electrode,*

*the second collecting electrode includes a second bus bar and a plurality of second finger electrodes extending from the second bus bar, and*

*a width of the first bus bar is smaller than a width of the second bub bar.*

* * * * *